(12) United States Patent
Freas, II

(10) Patent No.: US 11,072,442 B2
(45) Date of Patent: Jul. 27, 2021

(54) SPACE FLIGHT HABITATION SUPPORT APPLIANCE

(71) Applicant: The Boeing Company, Chicago, IL (US)

(72) Inventor: George Wilson Freas, II, Huntsville, AL (US)

(73) Assignee: The Boeing Company, Chicago, IL (US)

( * ) Notice: Subject to any disclaimer, the term of this patent is extended or adjusted under 35 U.S.C. 154(b) by 247 days.

(21) Appl. No.: 16/111,052

(22) Filed: Aug. 23, 2018

(65) Prior Publication Data

US 2020/0062428 A1 Feb. 27, 2020

(51) Int. Cl.
*B64G 1/50* (2006.01)
*B64D 47/00* (2006.01)
*H01L 35/28* (2006.01)
*D06F 58/00* (2020.01)

(52) U.S. Cl.
CPC ............... *B64G 1/50* (2013.01); *B64D 47/00* (2013.01); *D06F 58/00* (2013.01); *H01L 35/28* (2013.01)

(58) Field of Classification Search
CPC .......... B60G 1/50; B64D 47/00; D06F 58/00; D06F 37/00; H01L 35/28; F28F 13/12; F28F 5/02; F28F 5/04; F28F 5/06; F28D 11/06; F28D 7/10
See application file for complete search history.

(56) References Cited

U.S. PATENT DOCUMENTS

| | | | | |
|---|---|---|---|---|
| 1,533,865 A | * | 4/1925 | Jones ....................... | A23G 9/06 62/516 |
| 2,583,600 A | * | 1/1952 | Schreiber ................ | A47J 19/00 425/191 |
| 3,613,160 A | * | 10/1971 | Loomans et al. ..... | B29C 48/687 425/209 |

(Continued)

FOREIGN PATENT DOCUMENTS

| | | |
|---|---|---|
| GB | 2466336 A | 6/2010 |
| JP | 2001211831 A | 8/2001 |

(Continued)

OTHER PUBLICATIONS

U.S. Appl. No. 14/180,852, Examiner Interview Summary dated Jul. 13, 2018, 3 pgs.

(Continued)

*Primary Examiner* — Tho V Duong
(74) *Attorney, Agent, or Firm* — Kwan & Olynick LLP

(57) ABSTRACT

Systems, methods, and devices are disclosed for implementing habitation support appliances. Devices may include a housing defining an internal volume, the housing having an inner surface and an outer surface, the inner surface including a helical groove. Devices may also include a front plate coupled to a first end of the housing, an end plate coupled to a second end of the housing, the front plate and the end plate being configured to seal the internal volume, a thermal loop coupled to the outer surface of the housing, the thermal loop configured to transfer thermal energy with the housing and the internal volume, and a mixing device configured to be positioned within the internal volume, and configured to be moved along the helical groove of the inner surface.

20 Claims, 16 Drawing Sheets

(56) References Cited

U.S. PATENT DOCUMENTS

| | | | |
|---|---|---|---|
| 3,675,903 A * | 7/1972 | Harper | B01F 7/00816 |
| | | | 366/290 |
| 4,540,288 A | 9/1985 | Pandolfi | |
| 4,649,810 A | 3/1987 | Wong | |
| 4,784,336 A * | 11/1988 | Lu | B02C 17/16 |
| | | | 241/171 |
| 5,363,746 A | 11/1994 | Gordon | |
| 5,460,209 A | 10/1995 | Jandura et al. | |
| 5,975,366 A | 11/1999 | Ridgley | |
| 6,523,994 B2 | 2/2003 | Lawson | |
| 6,793,387 B1 | 9/2004 | Neas et al. | |
| 10,206,539 B2 | 2/2019 | Freas | |
| 2007/0084951 A1 * | 4/2007 | Ueno | B02C 17/1815 |
| | | | 241/65 |
| 2008/0257168 A1 | 10/2008 | Wolfe | |
| 2010/0008180 A1 | 1/2010 | Krogh | |
| 2010/0139500 A1 * | 6/2010 | Bravo | A23G 9/305 |
| | | | 99/455 |
| 2010/0229572 A1 | 9/2010 | Raiju et al. | |
| 2010/0260005 A1 | 10/2010 | Bodum | |
| 2010/0301042 A1 | 12/2010 | Kahlert | |
| 2011/0116340 A1 | 5/2011 | Gerl et al. | |
| 2014/0377071 A1 * | 12/2014 | Kim | D06F 25/00 |
| | | | 416/185 |
| 2015/0230664 A1 | 8/2015 | Freas, II | |
| 2016/0353932 A1 | 12/2016 | Freas, II | |

FOREIGN PATENT DOCUMENTS

| | | |
|---|---|---|
| JP | 2003505011 A | 2/2003 |
| JP | 2012217743 A | 11/2012 |
| WO | 0070963 A1 | 11/2000 |

OTHER PUBLICATIONS

U.S. Appl. No. 15/236,667, Non Final Office Action dated Apr. 2, 2019, 11 pgs.

U.S. Appl. No. 15/238,667, Restriction Requirement dated Nov. 2, 2018, 8 pgs.

Japanese Application Serial No. 2015-016364, Office Action dated Jan. 22, 2019, 13 pgs.

"U.S. Appl. No. 14/180,852, Advisory Action dated Sep. 14, 2017", 3 pages.

"U.S. Appl. No. 14/180,852, Final Office Action dated Jun. 26, 2017", 19 pgs.

"U.S. Appl. No. 14/180,852, Non Final Office Action dated Dec. 8, 2017", 16 pages.

"U.S. Appl. No. 14/180,852, Non Final Office Action dated Dec. 14, 2016", 15 pages.

"U.S. Appl. No. 14/180,852, Restriction Requirement dated Sep. 22, 2016", 7 pages.

"U.S. Appl. No. 14/180,852, Notice of Allowance dated Jul. 19, 2018", 16 pages.

"Bartendro—A Cocktail Dispensing Robot", Kickstarter, Retrieved from the Internet: <http://www.kickstarter.com/projects/partyrobotics/bartendro-a-cocktail-dispensing-robot>, Accessed on Feb. 5, 2014, 11 pgs.

"Breadmakershopper.com", The Home Baker, Retrieved from the Internet: <http://breadmakershopper.com/andrew-james/andrew-james-premium-breadmaker-with-automatic-ingredientsnut-and-raisin-dispensera-brand-you-can-trust/,>, Accessed on Feb. 5, 2014, Dec. 2, 2012, 7 pgs.

"Canadian Application Serial No. 2,876,485, Office Action dated Dec. 4, 2015", 3.

"European Application Serial No. 15155226.2, Search Report dated Jun. 19, 2015", 6 pgs.

"Food Printing—"The Killer App" of 3D Printing", 3Ders.org, Retrieved from the Internet: <http://www.3ders.org/articles/20111030-food-printing-the-killer-app-of-3d-printing.html>, Accessed on Feb. 5, 2014, Oct. 30, 2011, 9 pgs.

"Moley", Retrieved from the Internet: http://moley.com/#, Accessed on May 28, 2015, 11 pgs.

"Real-life Star Trek 'replicator' makes meals in 30 seconds", Retrieved from the Internet: http://www.metro.us/lifestyle/real-life-star-trek-replicator-makes-meals-in-30-seconds/zsJoel---bGrbNRIDR5izk/, Accessed on May 15, 2015, 2 pgs.

"Seville", DarenthMJS Ltd., Retrieved from the Internet: <http://www.darenthmjs.com/seville/>, Accessed on Feb. 5, 2014, 2014, 2 pgs.

"The Coming Food Printer Revolution", FuturistSpeaker.com, Retrieved from the Internet: <http://www.futuristspeaker.com/2011/10/the-coming-food-printer-revolution/http://www.futuristspeaker.com/2011/10/the-coming-food-printer-revolution/>, Accessed on Feb. 5, 2014, Oct. 4, 2011, 16 pgs.

Daugherty, Trevor, "The Yecup 365 travel mug uses your iphone to heat or cool your drink", 9T05Toys, Accessed on Aug. 16, 2016, Retrieved from the Internet: http://9to5toys.com/2016/04/04/yecup-365-travel-mug/, 5 pgs.

Garfield, Leanna, "MIT students invented a robotic kitchen that could revolutionize fast food", Tech Insider, Retrieved from the Internet: http://www.techinsider.io/mit-students-invented-a-robotic-kitchen-2016-4, Apr. 18, 2016, 5 pgs.

Templeton, Graham, "NASA funds 3D food printer, to combat hunger in space and on Earth", ExtremeTech, Retrieved from the Internet: <http://www.extremetech.com/extreme/156355-nasa-funds-3d-food-printer-to-combat-hunger-in-space-and-on-earth>, Accessed on Feb. 5, 2014, May 21, 2013, 4 pgs.

\* cited by examiner

SPACE FLIGHT HABITATION SUPPORT APPLIANCE

TECHNICAL FIELD

This disclosure generally relates to habitation support appliances, and more specifically, to habitation support appliances capable of operation in aerospace operational environments.

BACKGROUND

Washers and dryers typically include separate chambers for washing and heating items. Furthermore, such washers and dryers are not able to function in extreme environments that may be encountered in aerospace environments, which may have stringent weight constraints as well as various physical constraints, such as low or zero-gravity (e.g., the International Space Station (ISS) as well as other space environments). In such contexts, traditional washers and dryers are limited, and soiled items, such as clothes, are destroyed by, for example, incineration when discarded from the ISS.

SUMMARY

Disclosed herein are systems, methods, and devices for implementing habitation support appliances. Devices may include a housing defining an internal volume, the housing having an inner surface and an outer surface, the inner surface including a helical groove. Devices may also include a front plate coupled to a first end of the housing, an end plate coupled to a second end of the housing, the front plate and the end plate being configured to seal the internal volume, a thermal loop coupled to the outer surface of the housing, the thermal loop configured to transfer thermal energy with the housing and the internal volume, and a mixing device configured to be positioned within the internal volume, and configured to be moved along the helical groove of the inner surface.

In some embodiments, the thermal loop is configured to heat or cool the internal volume of the housing. In various embodiments, the thermal loop includes a tube (e.g., a metallic tube), and the thermal loop is configured to heat the internal volume responsive to receiving heated thermal fluid, and is further configured to cool the internal volume responsive to receiving cooled thermal fluid, According to various embodiments, the devices also include a shaft positioned in the internal volume of the housing, and a motor coupled to the shaft and configured to rotate the shaft. In some embodiments, a rotation of the shaft rotates the mixing device. In various embodiments, the mixing device is configured to be coupled with the helical groove via a first retractable pin bearing. According to various embodiments, the inner surface of the housing further includes a circular groove at the second end of the housing. In some embodiments, the mixing device is a mixing blade.

Also disclosed herein are systems that include a housing defining an internal volume, the housing having an inner surface and an outer surface, the inner surface including a helical groove. The systems also include a front plate coupled to a first end of the housing, an end plate coupled to a second end of the housing, the front plate and the end plate being configured to seal the internal volume, a thermal loop coupled to the outer surface of the housing, the thermal loop configured to transfer thermal energy with the housing and the internal volume, and a basket configured to be positioned within the internal volume, and further configured to be moved along the helical groove of the inner surface. The systems further include a plunger disc configured to be positioned in the internal volume of the housing, a shaft positioned in the internal volume of the housing, a motor coupled to the shaft and configured to rotate the shaft, a thermal regulator inlet module coupled to a thermal inlet of the thermal loop, and configured to regulate thermal energy transferred to the housing. The systems also include a thermal regulator outlet module coupled to a thermal outlet of the thermal loop, and configured to regulate thermal energy transferred to a vehicle, and a plurality of electromagnetic motion control devices coupled to the front plate and the end plate, and configured to magnetically attract or repel the plunger disc positioned within the internal volume.

In some embodiments, the thermal regulator inlet module is configured to heat a thermal fluid entering the internal volume responsive to receiving a first current, and is further configured to cool thermal fluid entering the internal volume responsive to receiving a second current. In various embodiments, the thermal regulator outlet module is configured to heat the thermal fluid entering one of vehicle thermal loops responsive to receiving a third current, and further configured to cool thermal fluid entering one of the vehicle thermal loops, responsive to receiving a fourth current. According to various embodiments, the systems also include a mixing device configured to be positioned within the internal volume, and configured to be moved along the helical groove of the inner surface. In some embodiments, the mixing device is configured to be coupled with the helical groove via a first retractable pin bearing, and the basket is configured to be coupled with the helical groove via a second retractable pin bearing. In various embodiments, the mixing device is configured to be coupled with the basket. According to various embodiments, the inner surface of the housing further includes a circular groove at the second end of the housing. In some embodiments, the basket is a tumbler. In various embodiments, systems also include a cover configured to be coupled with the basket, and further configured to be coupled with shaft.

Further disclosed herein are methods that include receiving a plurality of washing parameters, positioning a mixing device within an internal volume of a housing, the housing having an inner surface and an outer surface, the inner surface having a helical groove, and positioning a basket within the internal volume of the housing. The methods also include providing cleaning fluid to the internal volume of the housing, implementing at least some of the plurality of washing parameters, the implementing including, at least in part, rotating the mixing device within the internal volume of the housing, and evacuating the cleaning fluid from the internal volume.

In some embodiments, the methods also include providing a thermal fluid to a thermal loop coupled to the outer surface of the housing. In various embodiments, the positioning of the mixing device includes rotating the mixing device while a first retractable pin bearing of the mixing device is extended and coupled with the helical groove. According to various embodiments, the methods also include retracting the first retractable pin bearing.

DETAILED DESCRIPTION

Figure 1A:
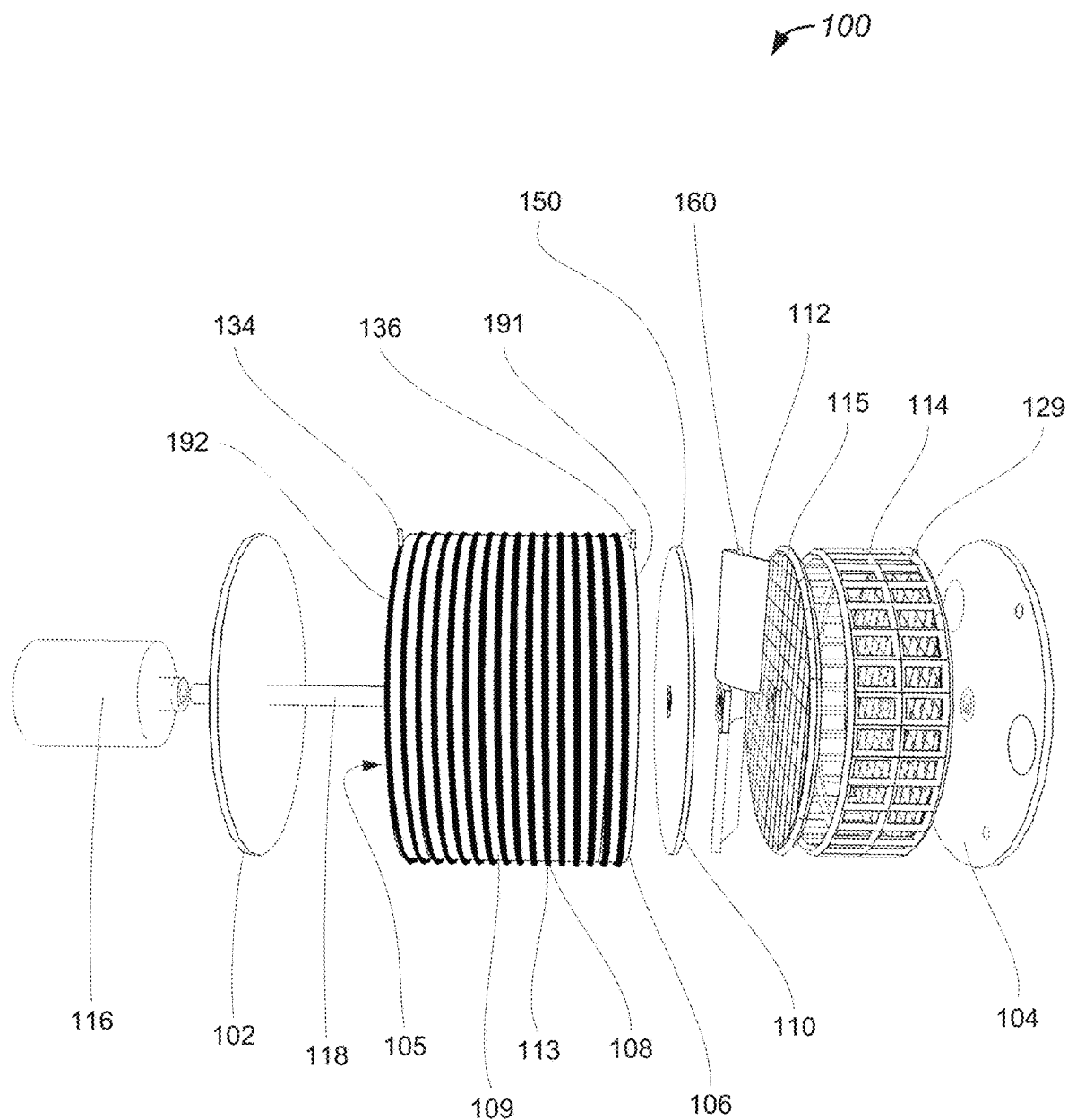
FIG. 1A illustrates an exploded view of an example of a habitation support appliance, configured in accordance with some embodiments.

In the following description; numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

Introduction

Traditional washers and dryers are not able to function in extreme environments that may be encountered in aerospace environments, which may have stringent weight constraints as well as various physical constraints, such as low or zero-gravity (e.g., the International Space Station (ISS) as well as other space environments). In such contexts, traditional washers and dryers are limited, and soiled items, such as clothes, are destroyed by, for example, incineration. During longer flights (such as a mission to Mars), it might not be possible to supply clean replacement items via supply flights making such management of soiled clothes impractical. Furthermore, experiments maybe conducted during such long flights, and such experiments may use centrifuges or pumps, which would take up more payload area on a spacecraft.

Various embodiments disclosed herein provide habitation support appliances configured to provide washing and drying capabilities in extreme environments which may have stringent weight/payload constraints, as well as low or zero gravity. As will be discussed in greater detail below a single housing may be used to achieve both washing and drying capabilities, and in a zero gravity environment. Moreover, habitation support appliances disclosed herein can be configured to implement a variety of additional features. For example, habitation support appliances can be configured to provide pumping operations for one or more ship or space station systems, as well as provide mixing operations for one or more materials as may be suited for experiments or other material preparation that may be conducted on ships or space stations.

In various embodiments, a habitation support appliance may include a housing defining an internal volume, where the housing has an inner surface and an outer surface, and the inner surface has a helical groove. Moreover, a front plate is coupled to a first end of the housing, an end plate is coupled to a second end of the housing, and the front plate and the end plate being are configured to seal the internal volume. In some embodiments, a mixing device is configured to be positioned within the internal volume, and is configured to be moved along the helical groove of the inner surface. Additionally, a basket is configured to be positioned within the internal volume and is configured to be moved along the helical groove of the inner surface. Moreover, a plunger disc is also configured to be positioned in the internal volume of the housing. Furthermore, a shaft is positioned in the internal volume of the housing, and a motor is coupled to the shaft and is configured to rotate the shaft such that a rotation of the shaft rotates the mixing device. Additionally, a thermal loop is coupled to the outer surface of the housing, and the thermal loop is configured to transfer thermal energy with the housing and the internal volume. In some embodiments, the thermal loop is configured to heat or cool the internal volume of the housing. Additional details regarding these features are now discussed in greater detail below.

Examples of Habitation Support Appliance

Figure 1B:
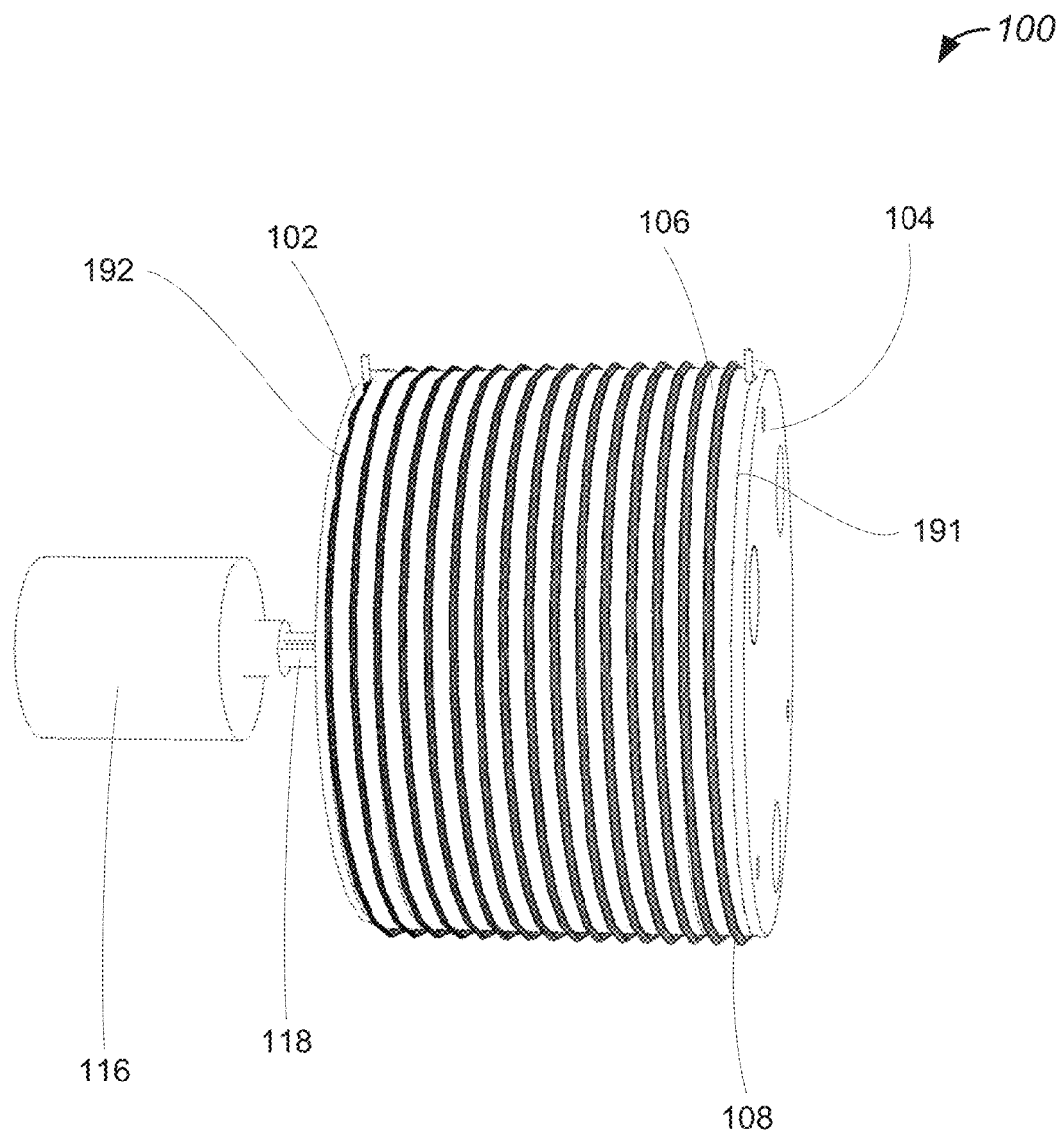
FIG. 1B illustrates a collapsed view of an example of a habitation support appliance, configured in accordance with some embodiments.

FIG. 1A is an exploded view of one example of habitation support appliance 100. FIG. 1B is a corresponding assembled view of this example. As discussed above, habitation support appliance 100 is configured to provide various support capabilities or functionalities for users in extreme environments, such as space stations, zero or low gravity environments. For example, habitation support appliance 100 may have centrifuge, mixing, washing, drying, and other like capabilities. In specific examples, habitation support appliance 100 may be used to launder clothes and/or other articles.

Figure 3:
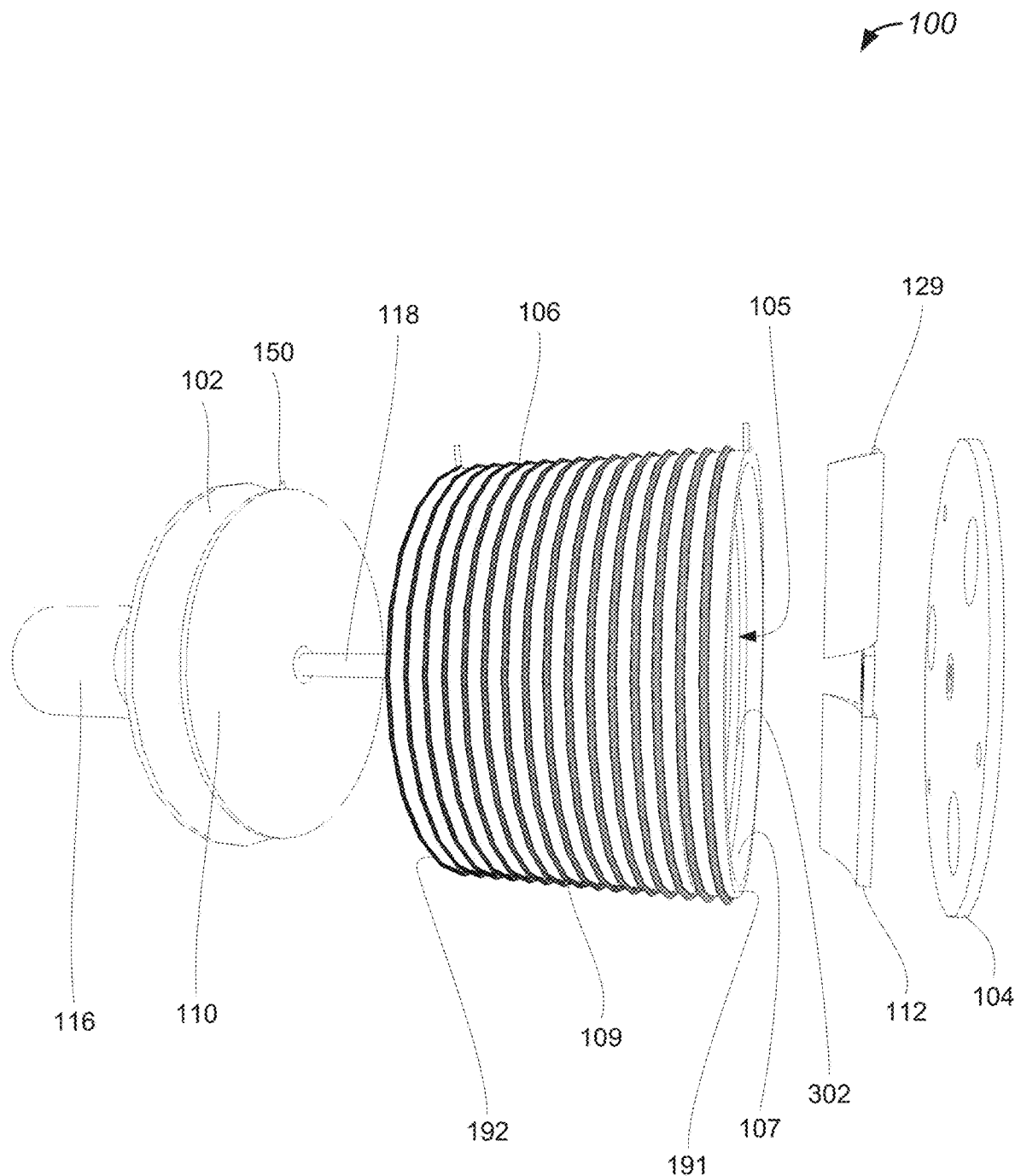
FIG. 3 shows an additional exploded view of components of habitation support appliance, configured in accordance with some embodiments.

Referring to FIGS. 1A, 1B, and 3, in one or more examples, habitation support appliance 100 includes a housing 106, a front plate 104, an end plate 102, a thermal loop 108, and a mixing device 112. Housing 106 defines an internal volume 105. Housing 106 has an inner surface 107 and an outer surface 109 as, for example, shown in FIG. 3. Inner surface 107 includes a helical groove 302. Referring to FIG. 1B, front plate 104 is coupled to first end 191 of housing 106. End plate 102 is coupled to second end 192 of housing 106. Front plate 104 and end plate 102 are configured to seal internal volume 105. Referring to FIG. 1A, thermal loop 108 is coupled to outer surface 109 of housing 106. Thermal loop 108 is configured to transfer thermal energy to and from housing 106 and internal volume 105. Referring to FIGS. 1A and 3, mixing device 112 is configured to be positioned within internal volume 105. Furthermore, mixing device 112 is configured to be moved along helical groove 302 of inner surface 107.

The coupling of front plate 104 and end plate 102 to housing 106 may seal internal volume 105 of housing 106 from the environment. This seal may be used to retain liquids and other materials within internal volume 105, such that these liquids and materials do not escape internal volume 105. The coupling may be removable, such that one or both of front plate 104 and end plate 102 may be decoupled from housing 106 and then recoupled back to housing 106. For example, a user may open habitation support appliance 100 (e.g., by decoupling one or both of front plate 104 and end plate 102 from housing 106) to place or remove contents from internal volume 105, change configuration of habitation support appliance 100, and perform other operations.

Housing 106 may be made of a thermally conductive material (e.g., having a thermal conductivity of at least 1 $W \times m^{-1} \times K^{-1}$), which is configured to transfer thermal energy between inner surface 107 and outer surface 109 of housing 106. This allows for thermal energy to flow between internal volume 105 (defined, in part, by inner surface 107) and thermal loop 108 (coupled to outer surface 109 of housing 106).

In some examples, thermal loop 108 is formed from a thermally conductive material, such as metal. Accordingly, thermal loop 108 may be coupled to housing 106 via soldering or other suitable coupling technique.

In some examples, thermal loop 108 is configured to heat or cool contents of internal volume 105 of housing 106, More specifically, thermal loop 108 may be configured to heat and/or cool (e.g., at different times) contents of internal volume 105 of housing 106. This heating and/or cooling feature may be used for cooking (e.g., heating or cooling food articles), cleaning (e.g., at elevated temperatures), and other like purposes. This heating and/or cooling feature is achieved by thermal loop 108, coupled to outer surface 109 of housing 106. This coupling or, more specifically, thermal coupling may be mechanical coupling or physical coupling. This coupling may also support thermal loop 108 on housing 106.

Figure 4:
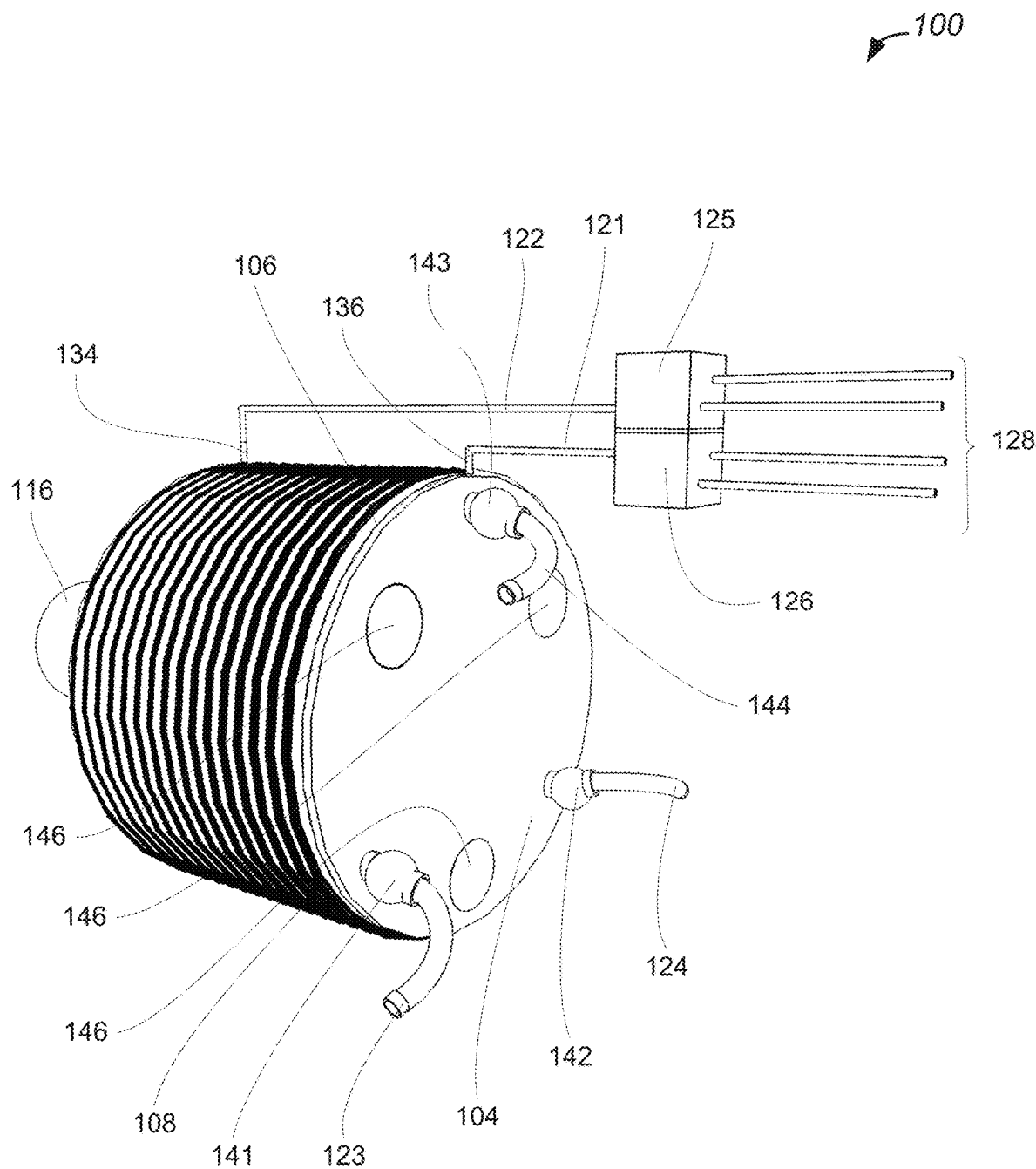
FIG. 4 illustrates a view of an example of a habitation support appliance, configured in accordance with some embodiments.

In some examples, thermal loop 108 is coupled to external components (e.g., reservoirs and pumps) via first thermal port 134 and/or second thermal port 136. Referring to FIG. 4, in some examples, first thermal port 134 is coupled to thermal inlet 122, which in turn is coupled to and receives thermal fluid from thermal regulator inlet module 125. Second thermal port 136 is coupled to thermal outlet 122, which in turn is coupled to and emits the thermal fluid to thermal regulator outlet module 126. As further described below, thermal regulator inlet module 125 and/or thermal regulator outlet module 126 are used to regulate thermal energy transferred to housing 106.

In various examples, thermal loop 108 includes one or more thermal sensors that are configured to measure and acquire temperature data associated with thermal loop 108. Accordingly, such sensors are configured to measure a temperature of the contents of thermal loop 108, and provide such data to an onboard processing device, and/or an external computer system.

In some examples, thermal loop 108 is separate from thermal loops of a vehicle, where habitation support appliance 100 is installed. For example, thermal loop 108 may be configured to use a different fluid than vehicle thermal loops. In such examples, thermal loop 108 may be still thermally coupled the vehicle thermal loops via one or more heat exchangers. For example, a heat exchanger may be a solid conductive block that thermally coupled to one or more portions of thermal loop 108 and one or more portions the vehicle thermal loops (e.g., these thermal loops may pass through the heat exchange).

Referring to FIG. 1A, in some examples, thermal loop 108 includes a tube 113, Thermal loop 108 is configured to heat internal volume 105 responsive to receiving heated thermal fluid. Furthermore, thermal loop 108 and is further configured to cool internal volume 105 responsive to receiving cooled thermal fluid. In these examples, the temperature of the heated thermal fluid is greater than that of internal volume 105. As such, the heat is transferred from the heated thermal fluid (through thermal loop 108 and the wall of housing 106) to internal volume 105. The temperature of the cooled first thermal fluid is less than that of internal volume 105. As such, the heat is transferred from internal volume 105 (through the wall of housing 106 and thermal loop 108) to the cooled thermal fluid. Accordingly, different thermal fluids may be applied for heating and cooling of internal volume 105 of housing 106 or, more specifically, controlling the temperature of internal volume 105 and any materials disposed within internal volume 105. It should be noted that the composition of the cooled thermal fluid and the heated thermal fluid may be the same or different. In some embodiments, the same thermal fluid may be used as a cooled thermal fluid and as a heated thermal fluid at different times. Some examples thermal fluids include, but are not limited to, water and its mixtures (e.g., with one or more glycols to reduce the operating temperature while maintaining the liquid phase).

Tube 113 may be a metallic tube or a tube made from another thermally conductive material (e.g., thermally conductive polymers). Tube 113 is configured to circulate a thermal fluid, such as a cooled thermal fluid and a heated thermal fluid.

Referring to FIG. 1A, in some examples, habitation support appliance 100 further includes a shaft 118 and a motor 116. Shaft 118 is positioned in internal volume 105 of housing 106, Motor 116 is coupled to shaft 118 and configured to rotate shaft 118. Specifically, motor 116 is configured to generate mechanical torque, which is used to rotate shaft 118. Motor 116 may be an electrical motor, pneumatic motor, or any other type of motor. Motor 116 may be positioned outside of internal volume 105, e.g., on the other side of end plate 102. In some examples, motor 116 may be supported by or attached to end plate 102. Shaft 118 may protrude through end plate 102 and may be sealed relative to end plate 102 using, e.g., second coupler 204 (e.g., sealed hole-containing coupler) in end plate 102. Shaft 118 transfers the mechanical torque from motor 116 to other components of habitation support appliance 100, such as mixing device 112.

In some examples, shaft 118 is coupled to mixing device 112 such that rotation of shaft 118 rotates mixing device 112. Rotation of shaft 118 (e.g., driven by motor 116) causes rotation of mixing device 112. This rotation in turn mixes contents of internal volume 105 (e.g., agitates and moves liquid sealed in internal volume 105). In some examples, shaft 118 is slotted to facilitate coupling with mixing device 112 and/or other components of habitation support appliance 100. Referring to FIG. 1A, in some examples, mixing device 112 is a blade or, more specifically, a mixing blade.

In some examples, mixing device 112 is configured to be coupled to helical groove 302 via first retractable pin bearing 160. Helical groove 302 has a helical geometry, and is configured to receive retractable pin bearings of various components, such first retractable pin bearing 160 of mixing device 112, second retractable pin bearing 150 of plunger disc 110, and third retractable pin bearing 129 of basket 114. In some examples, helical groove 302 may extend throughout inner surface 107 (e.g., the entire surface or a particular portion thereof).

When shaft 118 is rotated in a first rotation direction and first retractable pin bearing 160 is extended and inserted in helical groove 302, mixing device 112 is advanced in a first linear direction within internal volume 105 of housing 106. Furthermore, when shaft 118 is rotated in a second rotation direction (e.g., opposite of the first rotation direction) and first retractable pin bearing 160 is extended and inserted in helical groove 302, mixing device 112 is advanced in a second linear direction (e.g., opposite of the first linear direction) within internal volume 105 of housing 106. In this way, adjustments may be made to the position of mixing device 112 within internal volume 105 using first retractable pin bearing 160 and rotation of shaft. On the other hand, when first retractable pin bearing 160 is retracted, first retractable pin bearing 160 is not inserted in helical groove 302. In this operating regime, mixing device 112 may rotate in place, thus providing sustained mixing and agitation. In other words, mixing device 112 may free spin, since first retractable pin bearing 160 is not constrained by helical groove 302.

Retraction of first retractable pin beating 160 may be implemented manually by removing mixing device 112, and pushing first retractable pin bearing 160 inwards and turning first retractable pin beating 160 into the retracted position. In some examples, first retractable pin bearing 160 is locked in this retracted position. Extension of first retractable pin bearing 160 may also performed manually. For example, first retractable pin bearing 160 may turned from its locked position and springs (e.g., coil springs positioned under first retractable pin bearing 160) may push first retractable pin bearing 160 into the extended position. In another example, retraction and extension of first retractable pin bearing 160 is accomplished via remote activation of a magnetic actuator or solenoid, which may be included in first retractable pin bearing 160 or positioned externally. In this example, first retractable pin bearing 160 comprises the magnetic actuator, a battery, and a communications interface to communication with the remote controller (e.g., a computer system).

Figure 6:
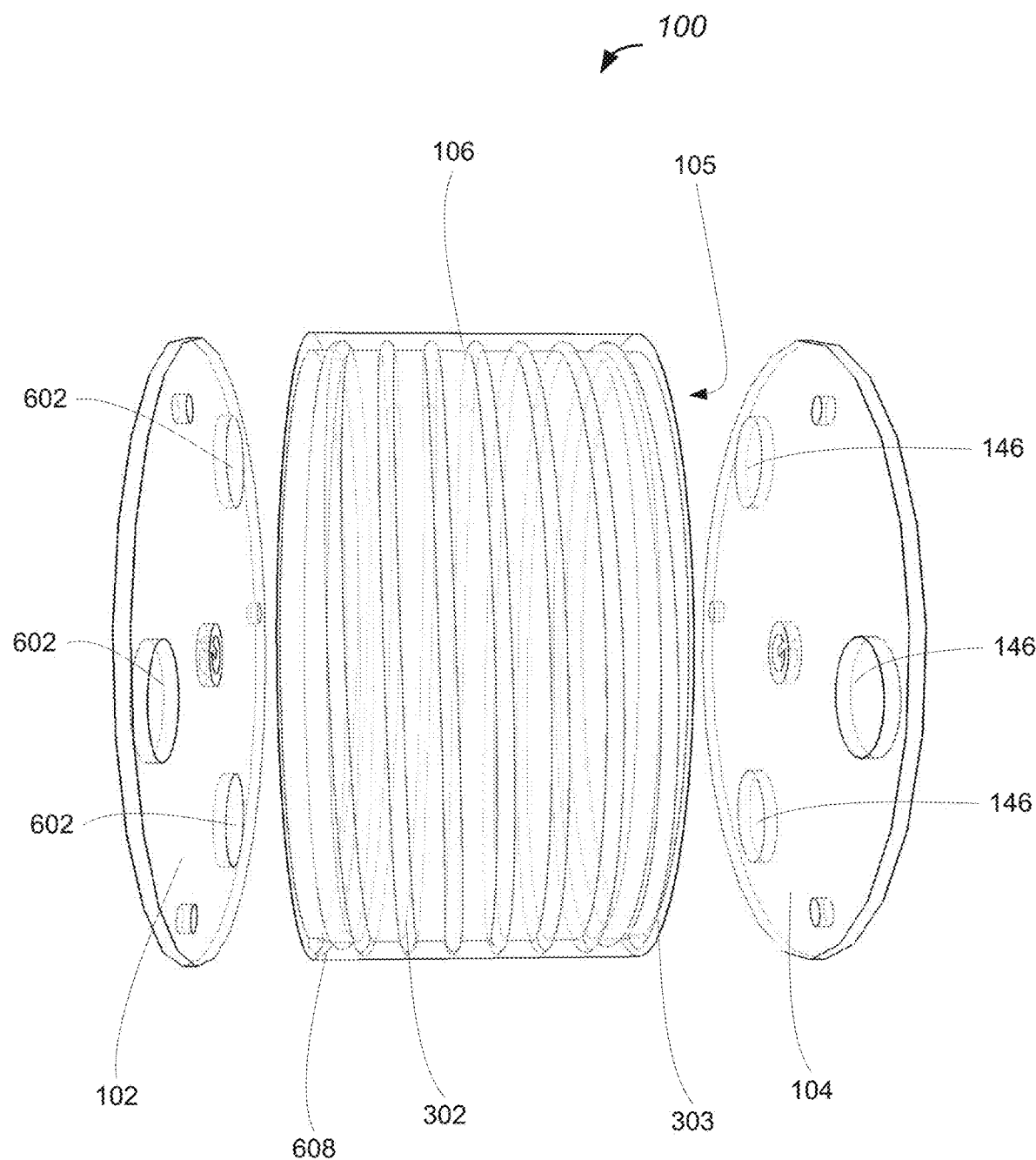
FIG. 6 illustrates a cut away view of a habitation support appliance having helical and circular grooves and end plates, configured in accordance with some embodiments.

Referring to FIG. 6, in some examples, inner surface 107 of housing 106 further includes a circular groove 303 at second end 192 of housing 106. Circular groove 303 is used for receiving second retractable pin bearing 150 of plunger disc 110 when plunger disc 110 is positioned within internal volume 105. Furthermore, helical groove 302 may receive second retractable pin bearing 1:50 of plunger disc 110. Specifically, plunger disc 110 may be engaged using one or more electro-magnetic motion control devices and moved within internal volume 105. This movement of plunger disc 110 may be used to displace liquid from internal volume 105. Furthermore, mixing device 112 and/or basket 114 may be moved between helical groove 302 and circular groove 303 using the same or different electro-magnetic motion control devices, in accordance with the cleaning cycle parameters, as further described below.

Figure 2:
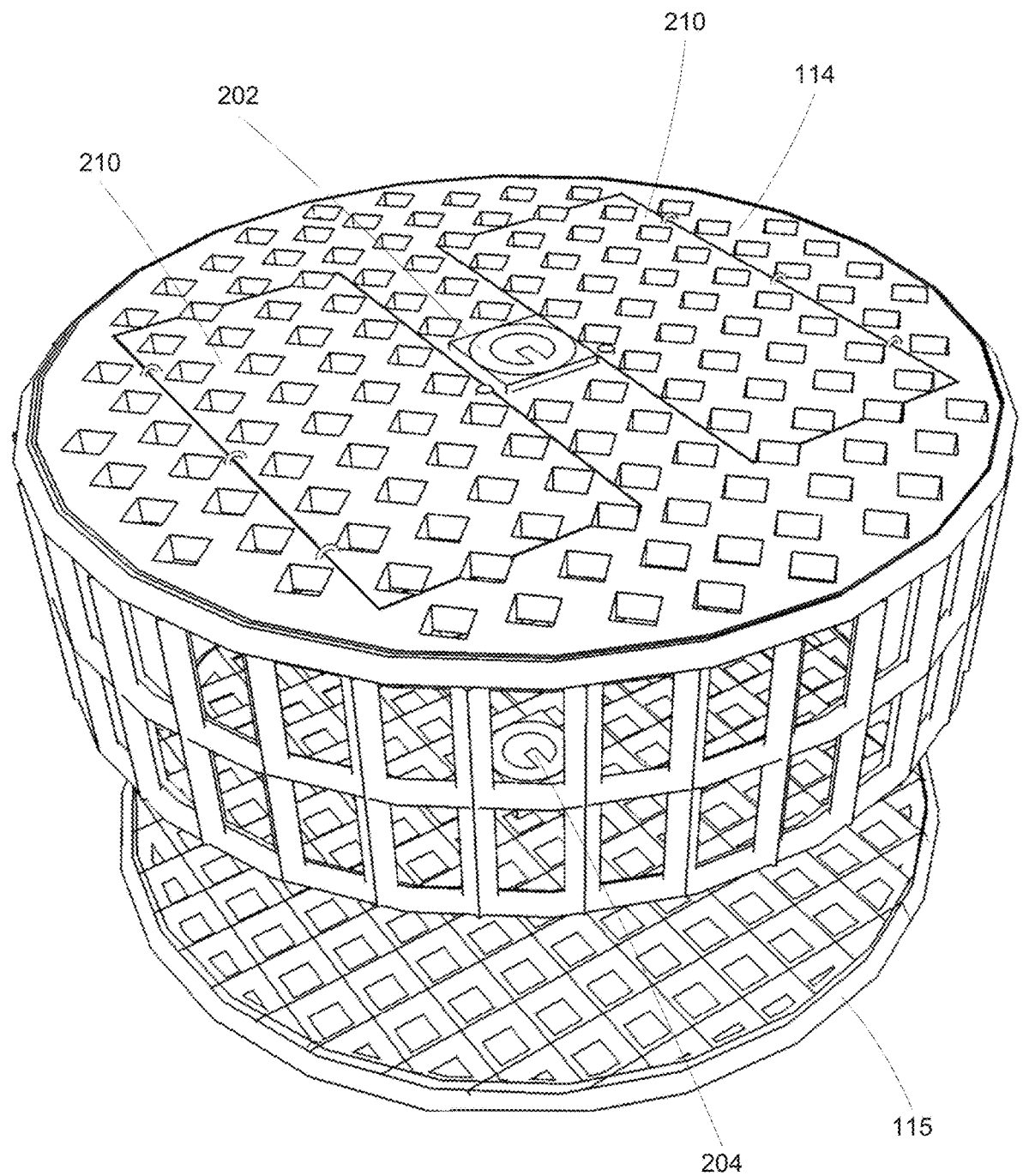
FIG. 2 illustrates an additional view of a basket, configured in accordance with some embodiments.

Referring to FIGS. 1A and 2, in some examples, habitation support appliance 100 further includes a basket 114. Basket 114 is configured to be positioned within internal volume 105. Basket 114 is configured to hold contents, such as clothing articles, utensils, and the like within internal volume 105 of housing 106. In one example, contents (e.g., clothes) may be placed into basket 114 and retained within basket 114 during washing and/or drying operations performed by habitation support appliance 100.

In some examples, basket 114 is coupled to shaft 118 and is configured to be rotated by shaft 118. As shown in FIG. 2, in some examples, basket 114 includes first coupler 202, used for coupling basket 114 to shaft 118. First coupler 202 may include a pin or a protrusion, which is inserted in a slot of shaft 118 during coupling. Furthermore, in some examples, basket 114 includes one or more doors 210, such as hinged doors. Doors 210 allow insertion and removal of basket's contents, e.g., without the removal of basket 114 from housing 106.

It will be appreciated that while FIG. 1A illustrates an example showing one basket 114 being used in habitation support appliance 100, other examples may include multiple baskets in the same habitation support appliance 100. For example, one or more additional basket (e.g., smaller baskets) may be coupled to the main basket to create a larger basket assembly with multiple compartments. In this example, one or more additional baskets may be used as compartments to wash smaller items (e.g., utensils), while the main basket may be used to wash larger or different items (e.g., clothes).

In some examples, basket 114 is configured to be moved along helical groove 302 of inner surface 107. For example, basket 114 may include a third retractable pin bearing 129. When extended, third retractable pin bearing 129 is inserted in helical groove 302 in inner surface 107 of housing 106. This engagement, coupled with the rotation of basket 114 by shaft 118, causes linear movement of basket 114 within internal volume 105. This features is used to move and position basket within internal volume 105.

Figure 1C:
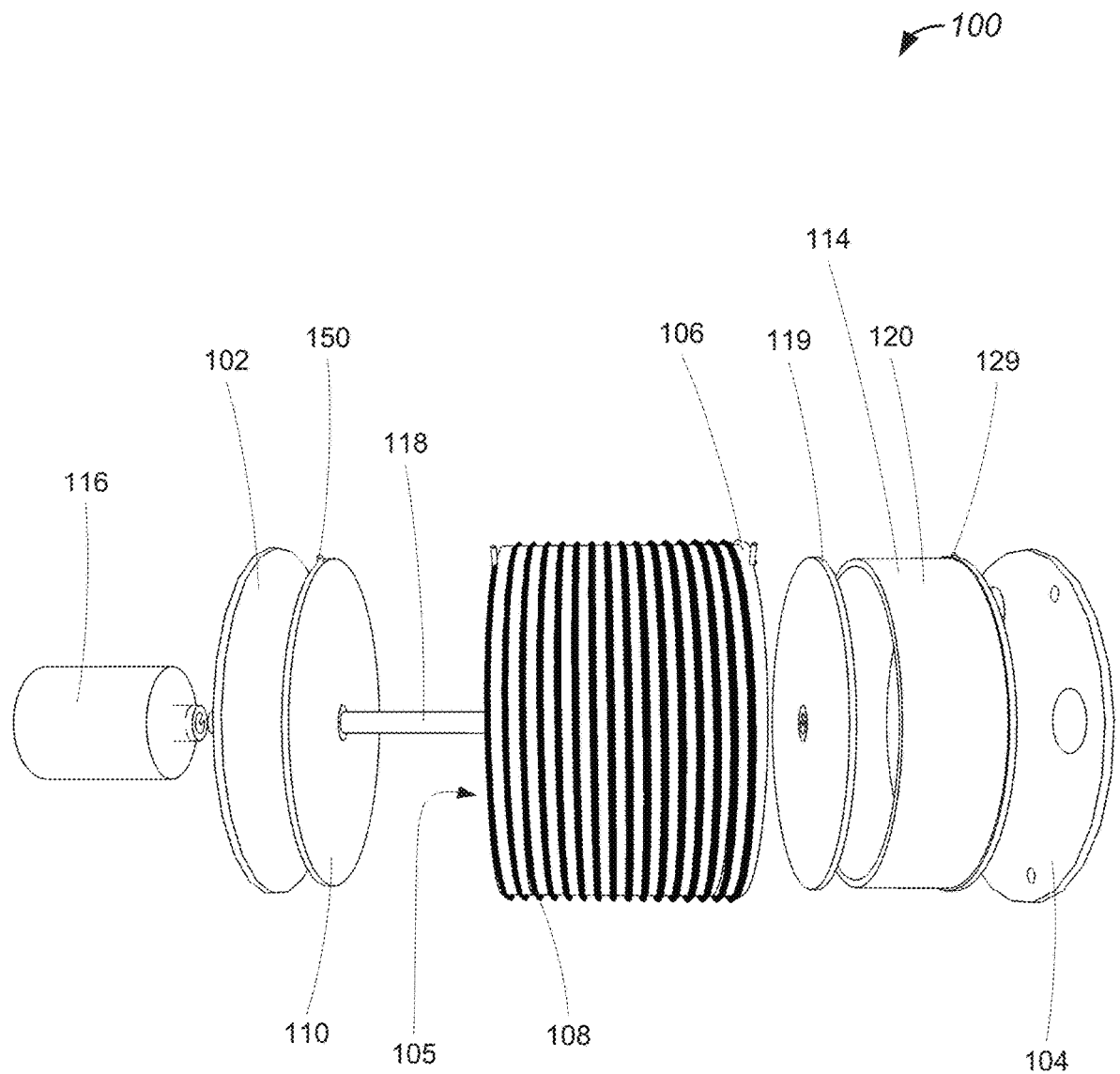
FIG. 1C illustrates an exploded view of an example of a habitation support appliance, configured in accordance with some embodiments.

Referring to FIG. 1C, basket 114 is a tumbler 120. Tumbler 120 is a specific example of basket 114 and contains fluids and other materials within basket 114. For example, tumbler 120 may provide a chamber, in which contents may be mixed. In this example, tumbler 120 may have blades internal to its volume. This chamber of tumbler 120 may be isolated from the rest of internal volume 105, unlike in other types of basket 114, which may have wall openings.

Referring to FIG. 2, in some examples, habitation support appliance 100 further includes a cover 115 configured to be coupled with basket 114. Cover 115 is used at an end of basket 114 to enclose contents within basket 114, e.g., when basket 114 is not tumbler 120. In some examples, cover 115 has second coupler 204, configured to couple cover 115 to shaft 118. In some examples, mixing device 112 is coupled to cover 115 using, e.g., spacers between mixing device 112 and cover 115. The spacers can ensure that mixing device 112 remains at the same distance from cover 115 during, e.g., washing and/or drying operations. Furthermore, cover 115 may be coupled to basket 114 and move together on shaft 118, e.g., when third retractable pin bearing 129 of basket 114 extends into circular groove 303 or helical groove 302.

Figure 5:
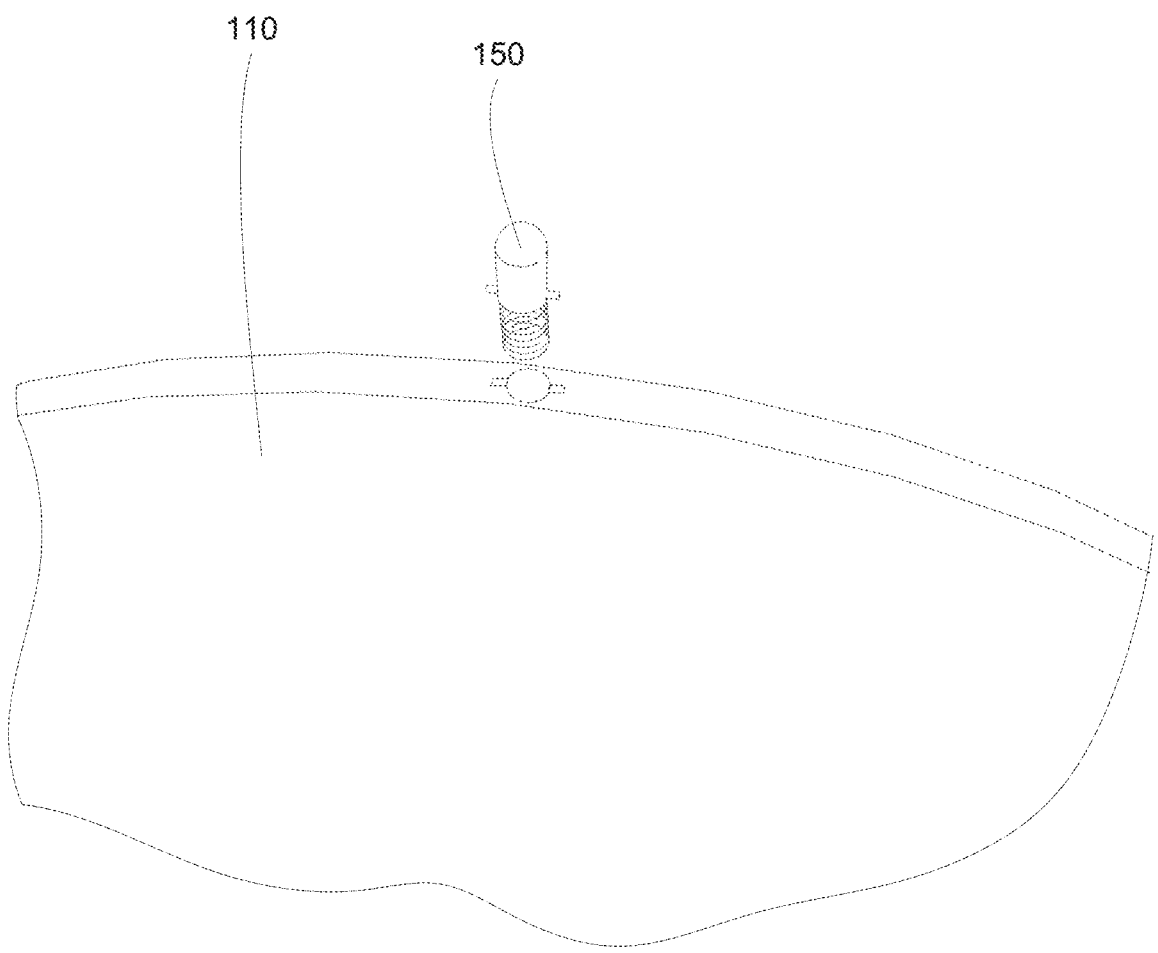
FIG. 5 illustrates a view of an example of a retractable pin bearing assembly implemented with a plunger disc, configured in accordance with some embodiments.

Referring to FIGS. 1A, 1C, and 3 in some examples, habitation support appliance 100 further includes a plunger disc 110 configured to be positioned in internal volume 105 of housing 106. Plunger disc 110 is configured to move laterally (along the rotation axis of shaft 118), which may be useful for various operations of habitation support appliance 100, e.g., washing, drying, and the like. Specifically, when shaft 118 rotates plunger disc 110 in a first rotation direction and when second retractable pin bearing 150 is extended and engages helical groove 302, plunger disc 110 may be advanced in a first linear direction within internal volume 105 of housing 106. This movement of plunger disc 110 may force the contents of internal volume 105 to one side of housing 106, e.g., near front plate 104. Furthermore, when shaft 118 is rotated in a second rotation direction (e.g., opposite of the first rotation direction) and when second retractable pin bearing 150 is extended and engages helical groove 302, plunger disc 110 may be advanced in a second linear direction (e.g., opposite of the first linear direction) within internal volume 105 of housing 106, e.g., to end plate 102. The movement (e.g., retraction) of second retractable pin beating 150 may be implemented manually or via remote activation. FIG. 5 illustrates an example of second retractable pin bearing 150 that is spring loaded and secured into plunger disc 110. However, when second retractable pin bearing 150 is retracted and does not engage helical groove 302, the rotation of plunger disc 110 may not cause any linear movements.

In some examples, plunger disc 110 is configured to be coupled to mixing device 112. In these examples, a spacer may be disposed between plunger disc 110 and mixing device 112. Specifically, one or more coupling mechanisms, such as mechanical couplers or electromagnets and permanent magnets, may be used for this purpose. In one example, mixing device 112 and plunger disc 110 include electromagnets that couple mixing device 112 and plunger disc 110 when the electromagnets are activated. The electromagnets may be deactivated to decouple mixing device 112 from plunger disc 110. Such activation and deactivation function may be used for various operating modes of habitation support appliance 100.

Referring to FIGS. 4 and 6 in some examples, habitation support appliance 100 further includes a plurality of electro-magnetic motion control devices 146 coupled to front plate 104 and end plate 102. Electro-magnetic motion control devices 146 are configured to magnetically attract or repel plunger disc 110 positioned within internal volume 105, Electro-magnetic motion control devices 146 may include electro-magnets, configured to generate a first magnetic field, extending in a first direction, and a second magnetic field, extending in a second direction (e.g., opposite of the first direction). As such, electro-magnetic motion control devices 146 are configured to generate different magnetic fields that may attract or repeal various components within housing 106 that interact with electromagnetic fields (e.g., ferromagnetic, paramagnetic and diamagnetic metals). More specifically, electro-magnetic motion control devices 146 may generate different magnetic fields to move these components between circular groove 303 and helical groove 302 of housing 106.

In some examples, electro-magnetic motion control devices 146 include a processing logic device, configured to implement one or more parameters associated with one or more operations of habitation support appliance 100, such as washing, drying, or mixing operations. This processing logic device may be communicatively coupled to an external computer system to receive and update such parameters.

Referring to FIG. 6, in some examples, end plate 102 has a second set of electro-magnetic motion control devices, such as additional electro-magnetic motion control devices 602. Housing 106 includes circular groove 303 at first end 191 of housing 106 and additional circular groove 608 at second end 192. Moreover, housing 106 also includes helical groove 302, various functions of which are described above. In various examples, circular groove 303 and/or additional circular groove 608 are coupled to helical groove 302 to form a continuous path for various retractable pin bearings that may be inserted in these grooves.

Figure 8:
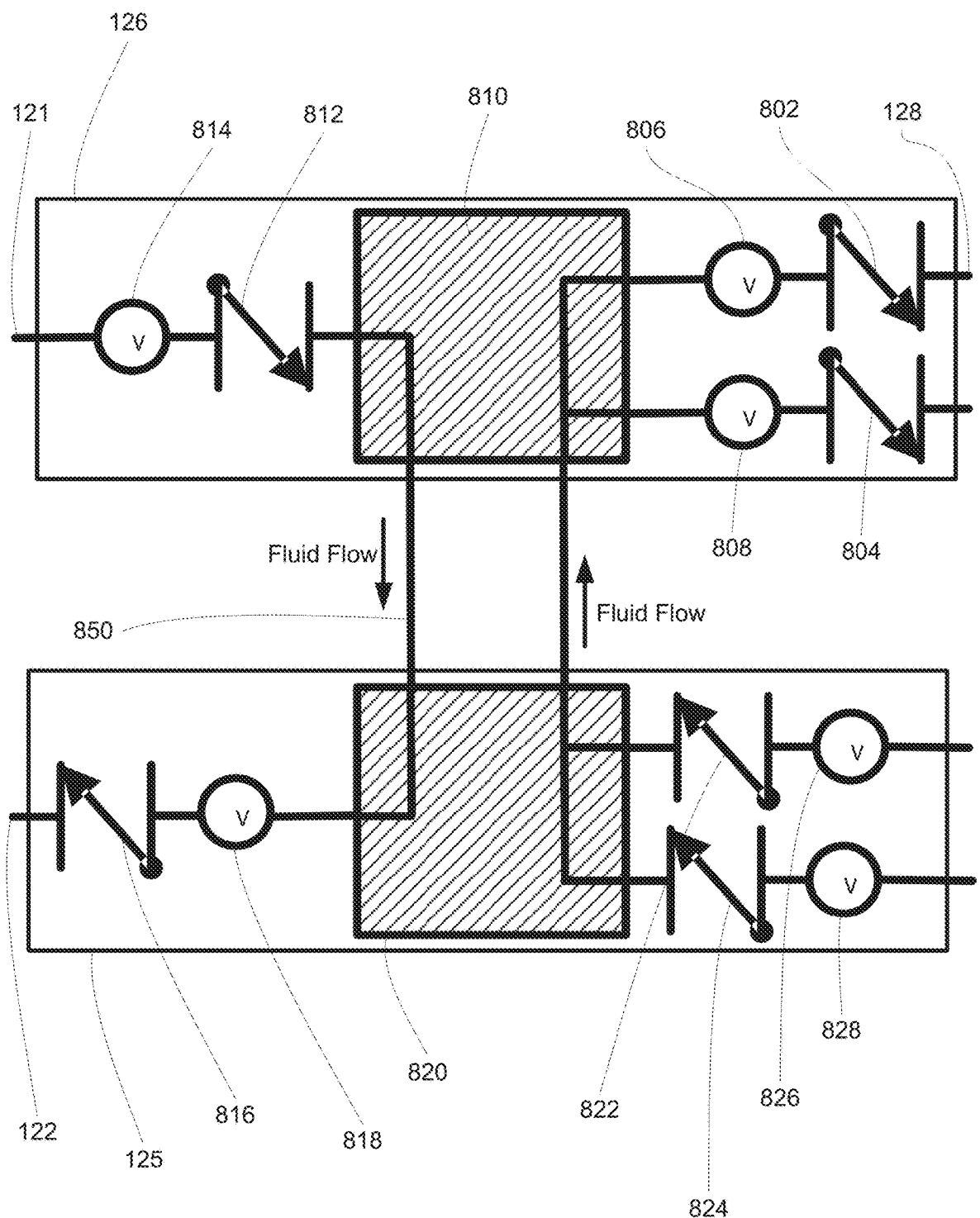
FIG. 8 illustrates a diagram of an example of thermal regulator modules, configured in accordance with some embodiments.

Referring to FIGS. 4 and 8 in some examples, habitation support appliance 100 further includes a thermal regulator inlet module 125 coupled to a thermal inlet 122 of thermal loop 108, Thermal regulator inlet module 125 is configured to regulate thermal energy transferred to housing 106. Furthermore, habitation support appliance 100 includes a thermal regulator outlet module 126 coupled to thermal outlet 121 of thermal loop 108. Thermal regulator outlet module 126 is configured to regulate thermal energy transferred to a vehicle equipped with habitation support appliance 100.

In various examples, thermal regulator inlet module 125 includes heating and cooling elements configured to heat or cool a fluid passing through thermal regulator inlet module 125. Thermal regulator inlet module 125 may be coupled to one or more vehicle thermal loops 128 and may be configured to receive a thermal fluid from one of vehicle thermal loops 128 and through thermal inlet 122.

Thermal regulator outlet module 126 may include heating and cooling elements configured to heat or cool fluid passing through thermal regulator outlet module 126. Thermal regulator outlet module 126 may be also coupled to one or more vehicle thermal loops 128 and is configured to provide the thermal fluid from thermal outlet 121 to one of vehicle thermal loops 128. In this way, thermal regulator outlet module 126 is configured to heat the thermal fluid entering one of vehicle thermal loops 128, responsive to receiving the third current, and is further configured to cool thermal fluid entering the same or another one of vehicle thermal loops 128 responsive to receiving the fourth current.

In some examples, thermal regulator inlet module 125 is configured to heat thermal fluid entering the internal volume 105 responsive to receiving a first current. Thermal regulator inlet module 125 is further configured to cool the thermal fluid entering the internal volume 105 responsive to receiving a second current. For example, thermal regulator inlet module 125 may include one or more Peltier devices. A Peltier device is a thermoelectric heat pump, also known as a solid-state active heat pump, which transfers heat from one side of the device to the other depending on the direction of the current passed through the device. Therefore, thermal regulator inlet module 125 may be used for both cooling and heating eliminating the need for two separate systems.

In some examples, thermal regulator outlet module 126 is configured to heat thermal fluid entering one of vehicle thermal loops 128 responsive to receiving a third current. Furthermore, thermal regulator outlet module 126 is further configured to cool thermal fluid entering one of the vehicle thermal loops 128 responsive to receiving a fourth current. For example, thermal regulator outlet module 126 may include one or more Peltier devices. A Peltier device is a thermoelectric heat pump, also known as a solid-state active heat pump, which transfers heat from one side of the device to the other depending on the direction of the current passed through the device. Therefore, thermal regulator outlet module 126 may be used for both cooling and heating, eliminating the need for two separate systems.

Referring to FIG. 4, habitation support appliance 100 comprises a first inlet hose 144, a second inlet hose 123, and an outlet hose 124. Each of these hoses may be connected to front plate 104 using a corresponding check valve. Specifically, first inlet hose 144 is connected using a first inlet check valve 143, second inlet hose 123 is connected using a second inlet check valve 141, and outlet hose 124 is connected using an outlet check valve 142. Various combinations of these hoses and valves can be used to supply and remove materials from internal volume 105. For example, first inlet hose 144 and first inlet check valve 143 may be used to supply one or more gases. Second inlet hose 123 and second inlet check valve 141 may be used to supply one or more liquids. Outlet hose 124 and outlet check valve 142 may be used for removal of gases and/or liquids.

FIG. 8 is a diagram of thermal regulator inlet module 125 or thermal regulator outlet module 125. In this example, thermal regulator outlet module 126 includes a second internal check valve 802 and a third internal check valve 804, as well as a second internal control valve 806 and a third internal control valve 808, which are coupled to vehicle thermal loops 128. Second internal control valve 806 and third internal control valve 808 are coupled to first thermal regulator 810, which is also coupled to first internal check valve 812. First thermal regulator 810 is configured to heat or cool contents of loops coupled to first thermal regulator 8110. First thermal regulator 810 may be configured as a heat exchanger between a local thermal loop, such as local thermal loop 850 and vehicle thermal loops 128.

In some examples, thermal regulator inlet module 125 includes fourth internal check valve 816, as well as fourth internal control valve 818. Fourth internal check valve 816 is coupled to thermal inlet 122. As described and shown elsewhere, thermal inlet 122 is coupled to thermal loop 108. Moreover, fourth internal control valve 818 is coupled with second thermal regulator 820. Second thermal regulator 820 is coupled to fifth internal check valve 822 and sixth internal check valve 824. Fifth internal check valve 822 is coupled to fifth internal control valve 826, while sixth internal check valve 824 is coupled to sixth internal control valve 828. Second thermal regulator 820 may be configured as a heat exchanger between a local thermal loop and vehicle thermal loops 128. In various examples, fifth internal control valve 826 and sixth internal control valve 828 are coupled to vehicle thermal loops 128.

Examples of Habitation Support Appliance Methods

Figure 9:
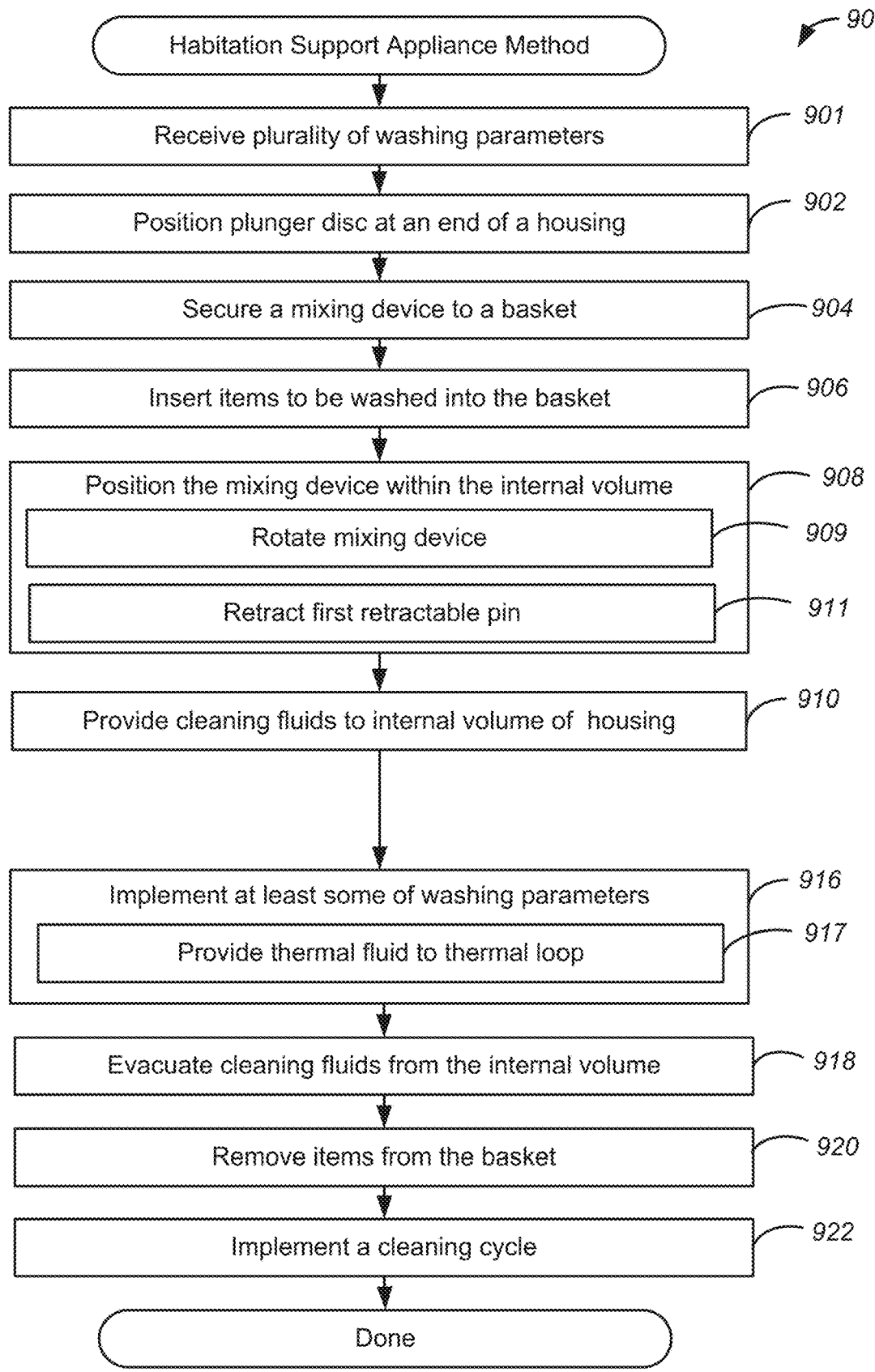
FIG. 9 illustrates a flow chart of a method for using a habitation support appliance, implemented in accordance with some embodiments.

FIG. 9 illustrates a flow chart of a method for using habitation support appliance 100, implemented in accordance with some examples. This method may be referred to as habitation support appliance method 900. As discussed above, habitation support appliance 100 is configured to implement one or more washing operations or other types of operations. Accordingly, various items to be washed or laundered, such as articles of clothing. Furthermore, such washing operations may be implemented in extreme operational environments, which may include zero to low gravity conditions.

In some examples, habitation support appliance method 900 includes receiving a plurality of washing parameters (block 901 in FIG. 9). Habitation support appliance method 900 further includes positioning mixing device 112 within internal volume 105 of housing 106 (block 908 in FIG. 9). Housing 106 has inner surface 107 and outer surface 109, and inner surface 107 has helical groove 302. Habitation support appliance method 900 further includes providing cleaning fluids to internal volume 105 of housing 106 (block 910 in FIG. 9). Habitation support appliance method 900 further includes implementing at least some of the plurality of washing parameters (block 916 in FIG. 9). The implementing may include, at least in part, rotating mixing device 112 within internal volume 105 of housing 106. Habitation support appliance method 900 further includes evacuating the cleaning fluids from internal volume 105 (block 918 in FIG. 9). Each of these operations will now be described in more detail. Habitation support appliance method 900 may include fewer or more operations. Various examples of these additional operations are described below.

Referring to block 901 in FIG. 9, the washing parameters may be stored at and received from a computer system, discussed in greater detail below with reference to FIG. 13. The computer system may be a part or connected to habitation support appliance 100. For example, the washing parameters may be stored in a memory or a persistent storage of the computer system. The washing parameters may be received by the processor controlling operation of various components of habitation support appliance 100. Some examples of the washing parameters include, but are not limited to, durations of various steps, the rotation speed of shaft 118 and mixing device 112, positions of various retractable pin bearings, operation of electro-magnetic motion control devices 146, parameters of thermal regulator inlet module 125 and/or thermal regulator outlet module 126, temperature of thermal loop 108, and the like.

Referring to block 908 in FIG. 9, mixing device 112 may be positioned within internal volume 105 of housing 106. For example, front plate 104 may be decoupled from housing. Mixing device 112 may be positioned within internal volume 105 and, in some examples, coupled to shaft 118. Front plate 104 may be coupled to housing 106, e.g., to seal internal volume 105 with mixing device 112 positioned within internal volume 105.

Referring to block 910 in FIG. 9, the cleaning fluid is provided to internal volume 105. The cleaning fluid may be provided via second inlet hose 123. Unlike first inlet hose 144, which may be used for delivering gases to internal volume, second inlet hose 123 may be configured to deliver fluids, in particular, the cleaning fluid. Some examples the cleaning fluid include water, soap, combinations thereof, and/or other types of the cleaning fluid. The amounts of the cleaning fluid delivered during this operation may be determined based on one or more washing parameters.

In various examples, hoses and check vales are used to control the entry and exit of materials into and out of housing 106. For example, front plate 104 is coupled to first inlet hose 144 and first inlet check valve 143 as shown in FIG. 4. First inlet hose 144 and first inlet check valve 143 control the entry of gases into housing 106. Moreover, front plate 104 is coupled to second inlet hose 123 and second inlet check valve 141, which are configured to control the entry of materials into housing 106. Furthermore, front plate 104 is coupled to outlet hose 124 and outlet check valve 142 which are configured to control the exit of materials from housing 106.

Figure 7:
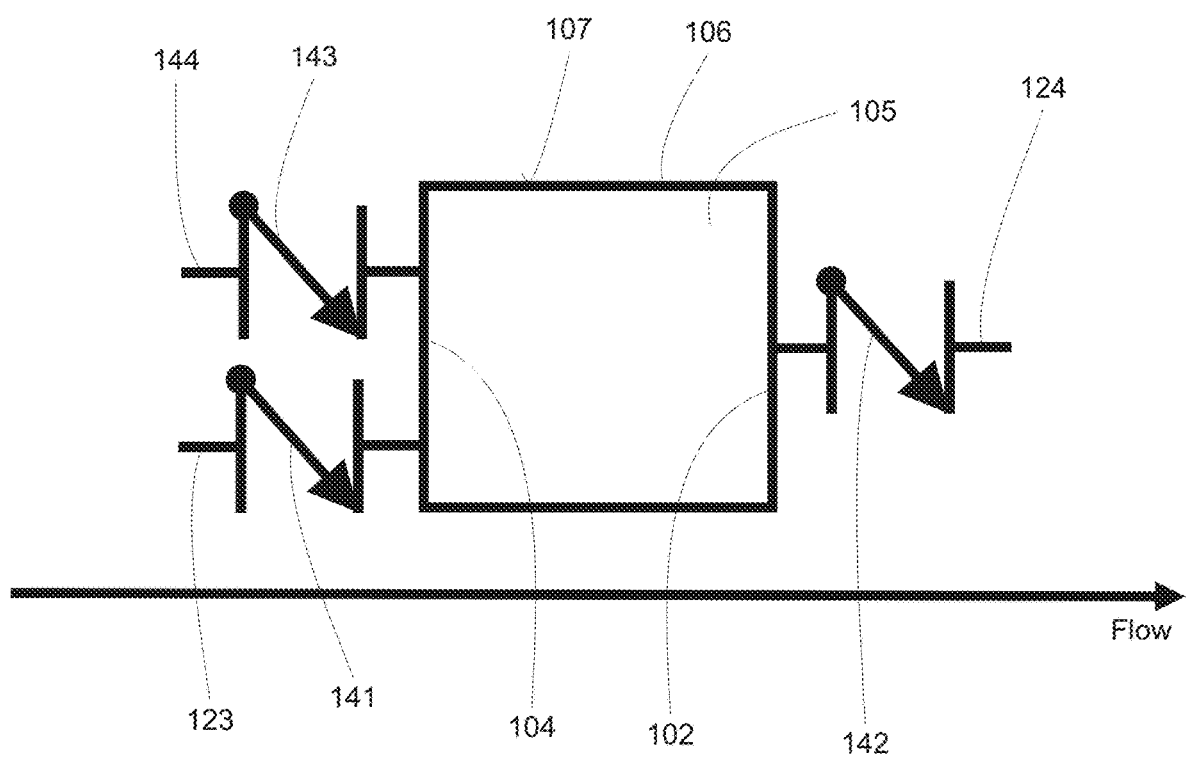
FIG. 7 illustrates a diagram of an example of valves coupled to a housing, configured in accordance with some embodiments.

FIG. 7 is a diagram of one example of various valves coupled to housing 106, configured in accordance with some examples. First inlet hose 144 is coupled to first inlet check valve 143, which in turn is coupled to housing 106. Second inlet hose 123 is coupled to second inlet check valve 141, which in turn is coupled to housing 106. First inlet check valve 143 and second inlet check valve 141 may be coupled to housing 106 at the same end. Outlet check valve 142 is also coupled to housing 106 (e.g., at an opposite end from first inlet check valve 143 and second inlet check valve 141). More specifically, first inlet check valve 143 and second inlet check valve 141 may be coupled to front plate 104, which in turn is coupled to housing 106. Outlet check valve 142 may be coupled to end plate 102, which in turn is coupled to housing 106 as, for example, shown in FIG. 7 and FIG. 4. Outlet check valve 142 is also coupled to outlet hose 124.

Referring to block 916 in FIG. 9, at least some of washing parameters are implemented during this operation. For example, mixing device 112 may be rotated within internal volume 105 of housing 106. In the same or other example, a rinse cycle may be performed. Specifically, a rinsing fluid (e.g., water) may be provided via second inlet hose 123 and additional rotation/agitation may be provided to rinse the contents of basket 114 with the rinsing fluid.

In some examples, implementing at least some of the plurality of washing parameters (block 916 in FIG. 9) includes providing a thermal fluid to thermal loop 108 coupled to outer surface 109 of housing 106 (block 917 in FIG. 9). For example, the thermal fluid may be supplied using thermal inlet 122, coupled to thermal loop 108, and removed using thermal outlet 121, also coupled to thermal loop 108. The temperature of the thermal fluid supplied to thermal loop 108 may be less or greater than the temperature of internal volume 105. For example, if internal volume 105 is to be heated, the temperature of the thermal fluid supplied to thermal loop may be greater than the temperature of internal volume 105. Alternatively, if internal volume 105 is to be cooled, the temperature of the thermal fluid supplied to thermal loop may be less than the temperature of internal volume 105.

In some examples, positioning of mixing device 112 (block 908 in FIG. 9) includes rotating mixing device 112 (block 909 in FIG. 9) while first retractable pin bearing 160 of mixing device 112 is extended and coupled with helical groove 302. Rotating mixing device 112 while first retractable pin bearing 160 is coupled with helical groove 302 causes mixing device 112 to change the lateral (linear) position of mixing device 112 within internal volume 105. This position-changing feature may be used to ensure adequate mixing within internal volume 105. The rotation of mixing device 112 may be performed using motor 116 and shaft 118, which is coupled to both mixing device 112 and motor 116.

Positioning mixing device 112 (block 908 in FIG. 9) within internal volume 105 of housing 106 further includes retracting first retractable pin bearing 160 (block 911 in FIG. 9). When first retractable pin bearing 160 is retracted, first retractable pin bearing 160 is no longer coupled with helical groove 302. As such, mixing device 112 may rotate freely, relative to housing 106, without causing any changes in the lateral position of mixing device 112.

Method 900 may involve positioning plunger disc 110 at an end of housing 106 (block 902 in FIG. 9). For example, plunger disc 110 may be positioned next to end plate 102. Alternatively, plunger disc 110 may be positioned next to front plate 104. The position change of plunger disc 110 may be achieved by rotating shaft 118, while plunger disc 110 is connected to shaft 118 and while second retractable pin bearing 150 engages helical groove 302. Furthermore, second retractable pin bearing 150 may be inserted in circular groove 303 in inner surface 107 of housing 106, when plunger disc 110 is positioned at the end of housing 106.

Method 900 may proceed with securing mixing device 112 to basket 114 (block 904 in FIG. 9). In some examples, mixing device 112 is also secured to cover 115 (e.g., using a spacer), which in turn is coupled to basket 114. For example, second coupler 204 of cover 115 may be used for this purpose. As such, mixing device 112 may rotate in tandem with both basket 114 and cover 115. In these examples, second retractable pin bearing 150 of mixing device 112 is retracted prior to being positioned into housing 106 (together with cover 115 and basket 114).

Method 900 may proceed with inserting one or more items into basket 114 (block 906 in FIG. 9). Accordingly, a user may place various items, such as articles of clothing, into basket 114. Cover 115 is then coupled to basket 114. Shaft 118 is also coupled to basket 114. In this way, the items to be washed are enclosed within basket 114 and cover 115, and basket 114 is coupled with shaft 118.

Method 900 may proceed with evacuating cleaning fluid from internal volume 105 (block 918 in FIG. 9). This operation may be also referred to as an evacuation cycle. Accordingly, once the rinse cycle has completed, the fluids within internal volume 105 may be drained via outlet hose 124. Furthermore, air may be provided via second inlet hose 123. Basket 114 may be rotated to implement a spin cycle that removes excess water from the contents of basket 114.

Method 900 may proceed with removing the contents from basket 114 (block 920 in FIG. 9). Accordingly, front plate 104 may be decoupled from housing 106. The operation may continue with decoupling cover 115 from basket 114. Alternatively, basket 114 may be removed from internal volume 105 and one or more doors 210 in basket 114 may be opened.

Method 900 may proceed with implementing a cleaning cycle (block 922 in FIG. 9). In some examples, front plate 104 is coupled to housing 106, and the cleaning fluid (e.g., water) is provided into internal volume 105. The cleaning fluid may be provided via second inlet hose 123. Furthermore, additional rotation of components, such as mixing device 112 and/or basket 114, may be used during this operation to provide additional washing and cleaning of such components. In various examples, mixing device 112 and/or basket 114 can be moved into helical groove 302, or back into circular groove 303 via electro-magnetic motion control devices, in accordance with the cleaning cycle parameters. Additionally, plunger disc 110 may be engaged via electro-magnetic motion control devices to move from circular groove 303 and enter helical groove 302. Plunger disc 110 may move in helical groove 302 from end plate 102 and circular groove 303 towards front plate 104, and thus remove liquid via outlet hose 124. In this way a cleaning cycle may be optionally implemented to provide cleaning of habitation support appliance 100 once the washing operations have been completed.

Figure 10:
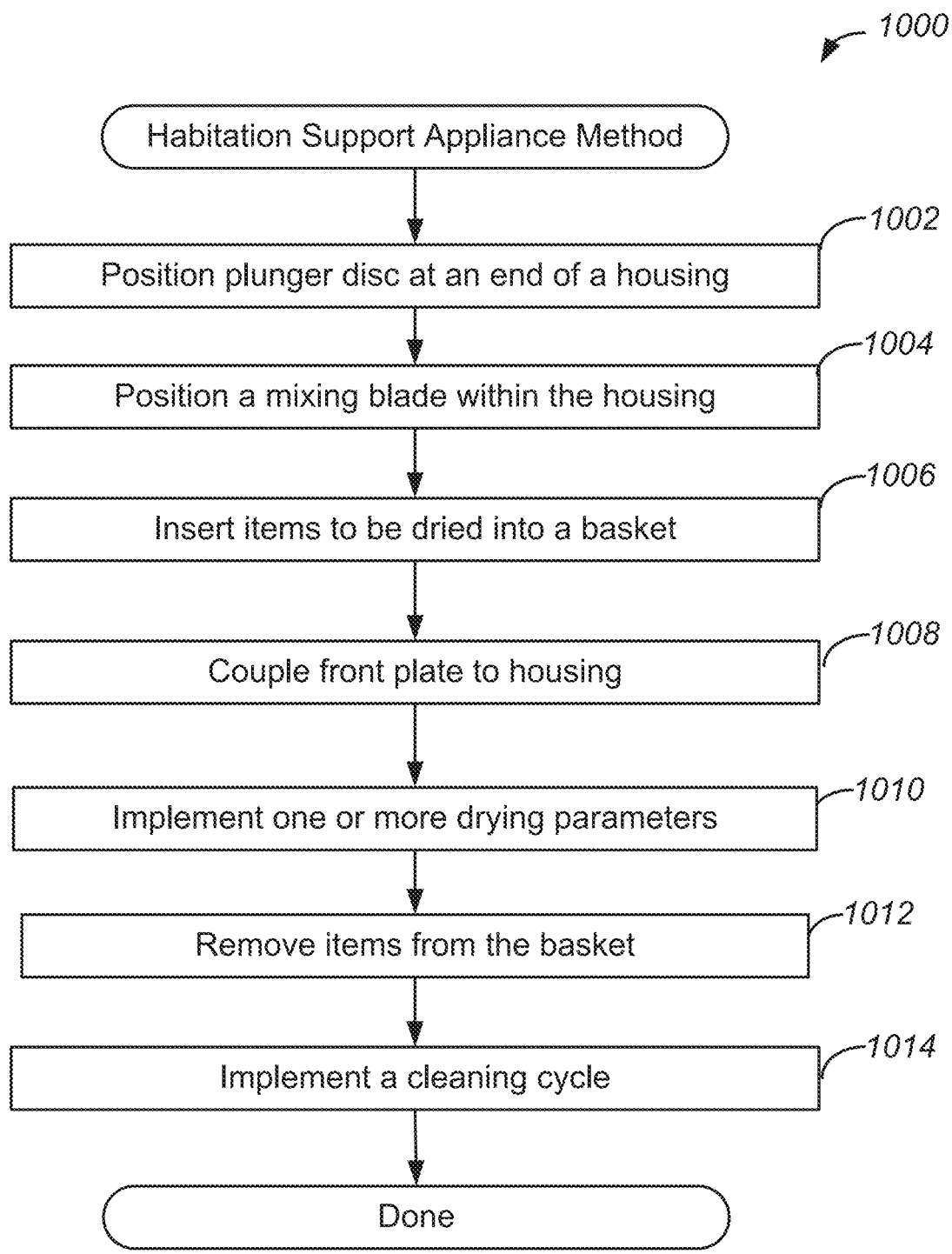
FIG. 10 illustrates a flow chart of another method for using a habitation support appliance, implemented in accordance with some embodiments.

FIG. 10 illustrates a flow chart of another method 1000 for using habitation support appliance 100. As discussed above, habitation support appliance 100 is configured to implement one or more drying operations. Method 1000 may commence with positioning plunger disc 110 at an end of housing 106 (block 1002 in FIG. 10). For example, plunger disc 110 may be moved within internal volume 105 via rotation of shaft 118. Plunger disk 110 may be positioned next to end plate 102, for example. During or at the end of this operation, second retractable pin bearing 150 is inserted in circular groove 303 in inner surface 107 of housing 106 at the end of housing 106 closest to end plate 102.

Method 1000 may proceed positioning mixing device 112 within housing 106 (block 1004 in FIG. 10). In some examples, the position of mixing device 112 may be a designated distance from cover 115 and basket 114. The distance may be selected to facilitate proper flow of air and/or fluid to the contents of basket 114. Moreover, first retractable pin bearing 160 may be retracted prior to positioning and affixing mixing device 112 relative to cover 115.

Method 1000 may proceed with inserting one or more items, to be dried, into basket 114 (block 1006 in FIG. 10). Accordingly, various items, such as articles of clothing, may be placed into basket 114. Cover 115 may be then coupled to basket 114. Shaft 118 is also coupled to basket 114. Third retractable pin bearing 129 of basket 114 is threaded within one of helical groove 302 or circular groove 303 in inner surface 107 of housing 106.

Method 1000 may proceed with coupling front plate 104 to housing 106 (block 1008 in FIG. 10). Coupling front plate 104 to housing 106 seals internal volume 105 of housing 106.

Method 1000 may proceed with implementing one or more drying parameters (block 1010 in FIG. 10). These drying parameters are used to control the operation of various components of habitation support appliance 100, such as the rotation of shaft 118, movement/position of basket 114 within internal volume 105, heat generation by thermal regulator inlet module 125, and the like. The heat is applied to housing 106 to facilitate heating and drying the contents of basket 114. Furthermore, rotation of basket 114 may be used to assist with drying.

Method 1000 may proceed with removing the contents of basket 114 (block 1012 in FIG. 10). Accordingly, front plate 104 may be decoupled from housing 106. The operation may proceed with decoupling cover 115 from basket 114 to access the contents.

Method 1000 may proceed with implementing a cleaning cycle (block 1014 in FIG. 10). In some examples, front plate 104 is coupled to housing 106. The cleaning fluid (e.g., water) is provided via second inlet hose 123 to wash the interior of housing 106. Furthermore, additional rotation of components, such as mixing device 112 and basket 114, may be used to provide additional washing and cleaning of such components. First retractable pin bearing 160 of mixing device 112 and/or third retractable pin bearing 129 of basket 114 can be moved into helical groove 302 or back into circular groove 303 via electro-magnetic motion control devices, in accordance with the cleaning cycle parameters. Additionally, plunger disc 110 may be engaged via electro-magnetic motion control devices to move from circular groove 303 and enter helical groove 302. Plunger disc 110 may move in helical groove 302 from end plate 102 and circular groove 303 towards front plate 104, and thus remove liquid via outlet hose 124. In this way a cleaning cycle may be optionally implemented to provide cleaning of habitation support appliance 100 after the drying operations have been completed.

In various examples, drying operations described above may be implemented after the washing operations described with reference to FIG. 9. In such examples, operations corresponding to blocks 1002, 1004, 1006, and 1008 are not performed, and method 1000 begins with operation 1010 because the contents to be dried are already included in basket 114.

Figure 11:
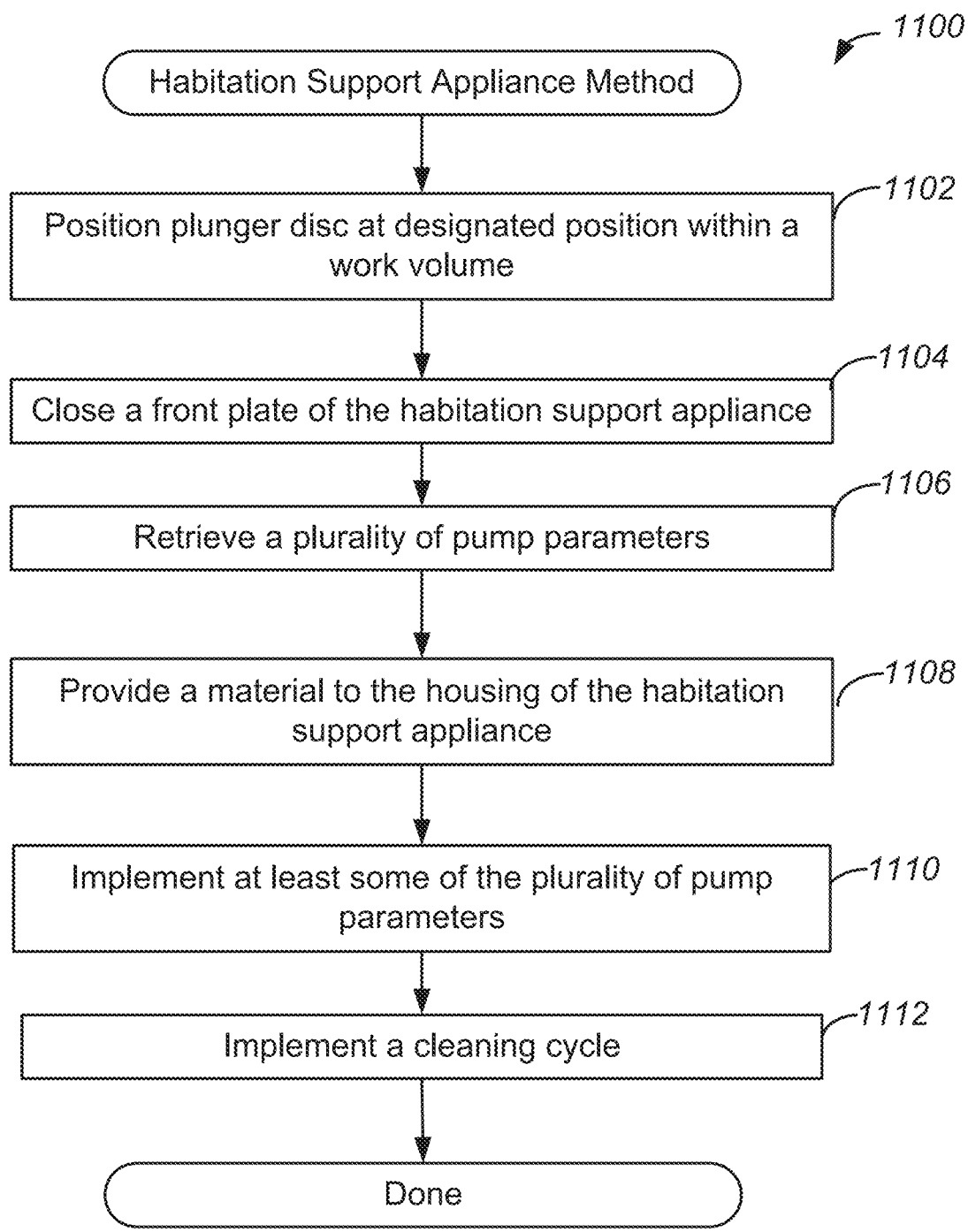
FIG. 11 illustrates a flow chart of yet another method for using a habitation support appliance, implemented in accordance with some embodiments.

FIG. 11 illustrates a flow chart of yet another method for using a habitation support appliance, implemented in accordance with some examples. In various examples, habitation support appliance 100 is configured to implement one or more pumping operations. Accordingly, as will be discussed in greater detail below, habitation support appliance 100 may be configured as a pump used to pump heated or cooled contents of housing 106. In various examples, such pumping operations are implemented without the use of basket 114, cover 115, and mixing device 112. Accordingly, in some examples of method 1100, basket 114, cover 115, and mixing device 112 are not included in habitation support appliance 100. As will also be discussed in greater detail below, such pumping operations may also be implemented in extreme operational environments, which may include zero to low gravity conditions.

Method 1100 may commence with positioning plunger disc 110 at a designated position within housing 106 (block 1102 in FIG. 11). For example, plunger disc 110 may be positioned, via rotation of shaft 118, at an end near end plate 102. In another example, plunger disc 110 may be positioned a designated distance from end plate 102 to achieve a predetermined size of an internal volume of housing 106. Furthermore, plunger disc 110 may be positioned such that second retractable pin bearing 150 is inserted in one of helical groove 302 or circular groove 303 on inner surface 107 of housing 106.

Method 1100 may proceed with coupling front plate 104 to housing 106 (block 1104 in FIG. 11). Accordingly, front plate 104 may be coupled to housing 106 to seal internal volume 105 so that the pumping operations may be implemented.

Method 1100 may proceed with receiving pump parameters (block 1106 in FIG. 11). In various examples, the pump parameters identify operational parameters of the pumping operations to be implemented, at least in part, by the components of habitation support appliance 100. For example, such pump parameters may identify an amount of heat to be applied via thermal regulator inlet module 125 and a rate at which plunger disc 110 is used to remove the contents of housing 106.

Method 1100 may proceed with providing a material to be pumped into housing 106 (block 1108 in FIG. 11). In various examples, this material may be a liquid and may be provided via second inlet hose 123. Alternatively, the material may be a gas and is provided via first inlet hose 144. The excess material may be pumped out via outlet hose 124. In various examples, an inlet check valve may be attached to second inlet hose 123 and/or first inlet hose 144. Outlet check valve 142 may be attached to outlet hose 124. In this way, the flow of material and gas can be controlled and regulated to flow into and out of housing 106. When the material is pumped into housing 106, one or both of first inlet check valve 143 and second inlet check valve 141 are open, and outlet check valve 142 is closed. Conversely, when material is pumped out of housing 106, one or both of first inlet check valve 143 and second inlet check valve 141 are closed, and outlet check valve 142 is open.

Method 1100 may proceed with implementing one or more pumping operations (block 1110 in FIG. 11). As similarly discussed above, such pumping operations may be implemented in accordance within the pumping parameters received during operation corresponding to block 1106. Accordingly, the material and/or gas received during operation corresponding to block 1108 is heated or cooled in accordance with the pumping parameters and is forced out through outlet hose 124. In various examples, the material is forced out via movement of plunger disc 110 towards front plate 104. A pressure of the output may be configured based on a speed at which plunger disc is moved. For example, if plunger disc 110 is moved faster, the output pressure generated may be greater. Conversely, if plunger disc 110 is moved slower, the output pressure generated may be lessened. In various examples, once the pumping operations have been implemented, plunger disc 110 may be returned to the original position of plunger disc 110.

Method 1100 may proceed with implementing a cleaning cycle (block 1112 in FIG. 11). In some examples, water may be provided via the first inlet port to wash the interior of housing 106. In this way a cleaning cycle may be optionally implemented to provide cleaning of habitation support appliance 100 once the pumping operations have been completed.

Figure 12:
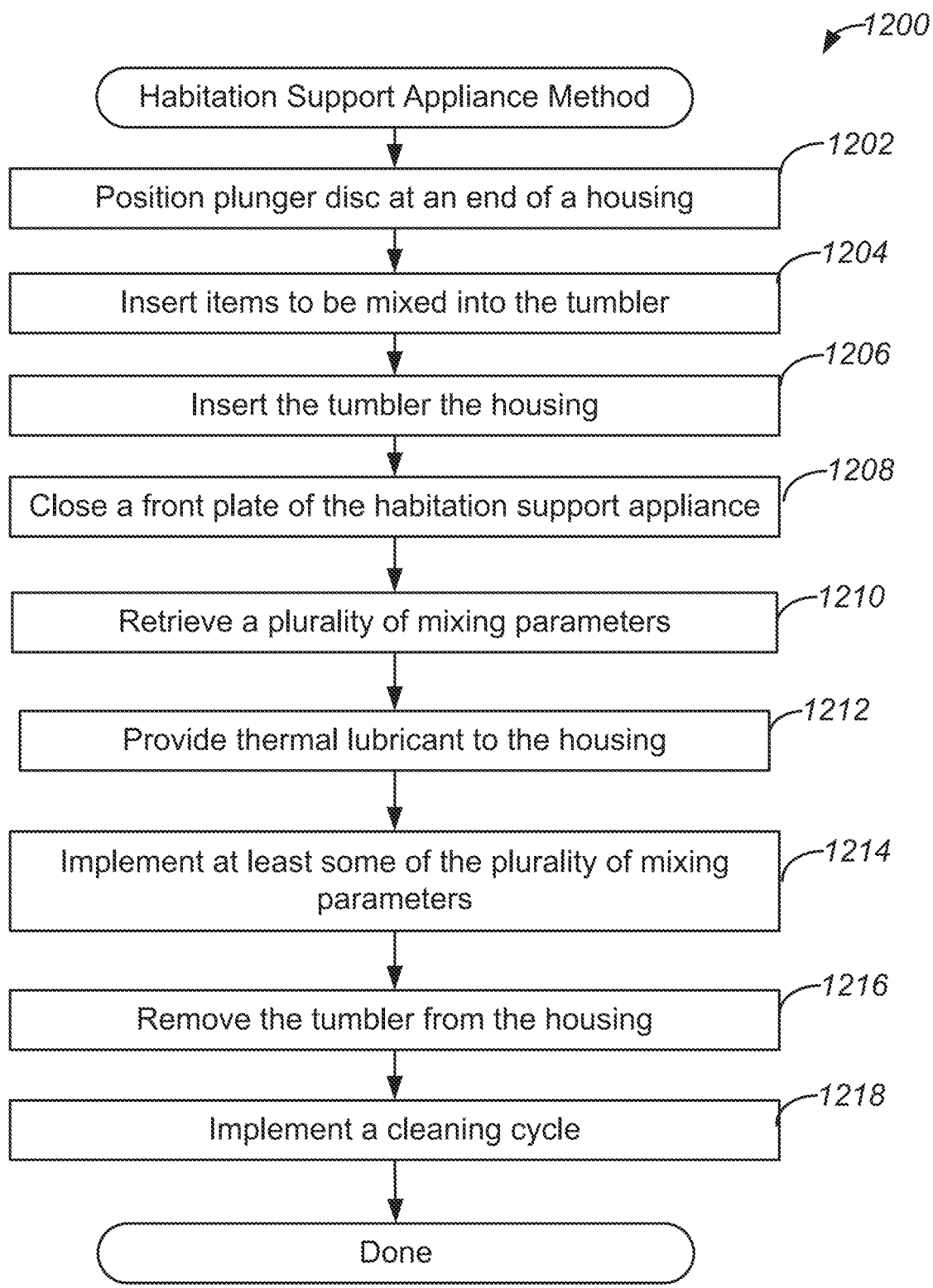
FIG. 12 illustrates a flow chart of an additional method for using a habitation support appliance, implemented in accordance with some embodiments.

FIG. 12 is a flow chart of yet another method 1200 for using habitation support appliance 100, implemented in accordance with some examples. Method 1200 may commence with positioning plunger disc 110 at an end of housing 106 (block 1202 in FIG. 12). For example, plunger disc 110 is positioned, via rotation of shaft 118, near end plate 102. In various examples, plunger disc 110 may be positioned such that second retractable pin bearing 150 is inserted in a circular groove 303 in inner surface 107 of housing 106 at the end of housing 106.

Method 1200 may proceed with placing tumbler 120 within housing 106 (block 1204 in FIG. 12). As described above, tumbler 120 is an impermeable container configured to contain fluids and other materials. In this embodiment, mixing device 112 is left out of housing 106, as tumbler 120 may have blades internal to housing 106. In various examples, third retractable pin bearing 129 of tumbler 120 may be threaded into the end of helical groove 302 on inner surface 107 of housing 106.

Method 1200 may proceed with inserting one or more items, to be mixed, into tumbler 120 (block 1206 in FIG. 12). Accordingly, various materials may be placed into tumbler 120. Tumbler 120 may be then coupled to shaft 118. In this way, the items to be mixed are placed within tumbler 120, and tumbler 120 is coupled with shaft 118.

Method 1200 may proceed with coupling front plate 104 to housing 106 (block 1208 in FIG. 12). Accordingly, front plate 104 may be coupled to housing 106 to seal internal volume 105 so that the mixing operations may be implemented.

Method 1200 may proceed with receiving mixing parameters (block 1210 in FIG. 12). In various examples, such mixing parameters control the operation of various components of habitation support appliance 100 to implement a particular set or sequence of mixing operations. For example, such mixing parameters may control the operation of motor 116 and the rotation of shaft 118. In this way, the mixing parameters control the rotation of the tumbler and rotation applied to the content included within the tumbler. The mixing parameters also control the operation of the thermal regulator inlet module 125 and thermal regulator outlet module 126 which may cause the application of heating or cooling during the mixing process.

Method 1200 may proceed with applying thermal lubricant to tumbler 120 (block 1212 in FIG. 12). In some examples, the thermal lubricant is configured to ensure proper thermal coupling between tumbler 120 and housing 106. Accordingly, the thermal lubricant may be applied and may cover an exterior of tumbler 120. The thermal lubricant will also contact housing 106. In this way, thermal coupling is provided between thermal loop 108, housing 106, and tumbler 120. The thermal lubricant may be a fluid of low viscosity, with a high thermal transfer coefficient. The thermal lubricant used for heat transfer may be different from the thermal lubricant used for cold transfer as the latter must be resistant to freezing.

Method 1200 may proceed with implementing the mixing parameters (block 1214 in FIG. 12). Accordingly, mixing operations such as the rotation of the tumbler and the application of heat, may be implemented in accordance with the previously received parameters. In this way, a sequence of mixing operations may be implemented to mix the contents of the tumbler.

Method 1200 may proceed with removing tumbler 120 may be removed (block 1216 in FIG. 12). Accordingly, once the mixing operations have completed, front plate 104 may be decoupled from housing 106. Tumbler 120 may be removed from internal volume 105.

Method 1200 may proceed with implementing a cleaning cycle (block 1218 in FIG. 12). In some examples, water may be provided via second inlet hose 123 to wash the interior of housing 106. In this way a cleaning cycle may be optionally implemented to provide cleaning of habitation support appliance 100 once the mixing operations have been completed.

Computer System Examples

Figure 13:
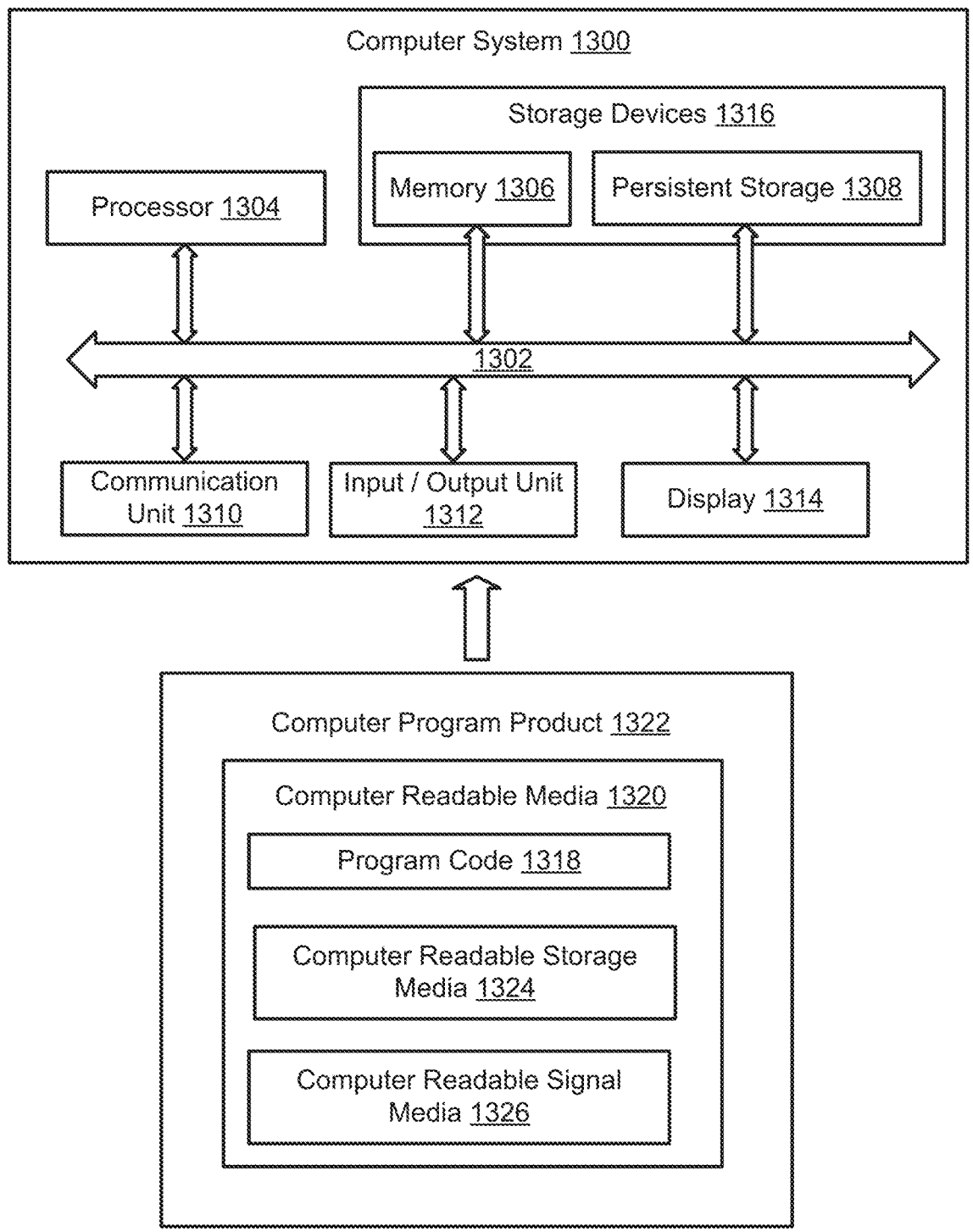
FIG. 13 illustrates a computer system configured in accordance with some embodiments.

FIG. 13 illustrates a computer system configured in accordance with some examples. In various examples, a computer system, such as system 1300, is configured to control the operation of one or more components of habitation support appliance 100 discussed above with reference to FIGS. 1A-12, and is also configured to store parameters utilized in the various operations discussed with reference to FIGS. 9-12.

In some examples, one or more components of system 1300 may be implemented as on-board components of habitation support appliance 100, and/or implemented within a laptop, an external hand held device, or built into a keypad/touchscreen display on habitation support appliance 100. In some examples, a discrete electronic control logic device is configured to regulate the thermal regulator inlet module 125 or thermal regulator outlet module 126 included within habitation support appliance 100. In some examples, the control logic may include a microprocessor or other logic circuits. According to various examples, the distribution of the computing functions and/or hardware may be determined based on one or more requirements of space flight, commercial flight, or commercial product certification. Moreover, according to some examples, one or more components of system 1300 may be implemented external to habitation support appliance 100. For example, data may be collected by on board sensors and provided to an external control computer system for analysis.

In various examples, computer system 1300 includes communications framework 1302, which provides communications between processor unit 1304, memory 1306, persistent storage 1308, communications unit 1310, input/output unit 1312, and display 1314. In this example, communications framework 1302 may take the form of a bus system.

Processor unit 1304 serves to execute instructions for software that may be loaded into memory 1306. Processor unit 1304 may be a number of processors, a multi-processor core, or some other type of processor, depending on the particular implementation.

Memory 1306 and persistent storage 1308 are examples of storage devices 1316. A storage device is any piece of hardware that is capable of storing information, such as, for example, without limitation, data, program code in functional form, and/or other suitable information either on a temporary basis and/or a permanent basis. Storage devices 1316 may also be referred to as computer readable storage devices in these illustrative examples. Memory 1306, in these examples, may be, for example, a random access memory or any other suitable volatile or non-volatile storage device. Persistent storage 1308 may take various forms, depending on the particular implementation. For example, persistent storage 1308 may contain one or more components or devices. For example, persistent storage 1308 may be a hard drive, a flash memory, a rewritable optical disk, a rewritable magnetic tape, or some combination of the above.

The media used by persistent storage 1308 also may be removable. For example, a removable hard drive may be used for persistent storage 1308.

Communications unit 1310, in these illustrative examples, provides for communications with other computer systems or devices. In these illustrative examples, communications unit 1310 may be a network interface card, universal serial bus (USB) interface, or other suitable communications device/interface.

Input/output unit 1312 allows for input and output of data with other devices that may be connected to computer system 1300. For example, input/output unit 1312 may provide a connection for user input through a keyboard, a mouse, and/or some other suitable input device. Further, input/output unit 1312 may send output to a printer. Display 1314 provides a mechanism to display information to a user.

Instructions for the operating system, applications, and/or programs may be located in storage devices 1316, which are in communication with processor unit 1304 through communications framework 1302. The processes of the different examples may be performed by processor unit 1304 using computer-implemented instructions, which may be located in a memory, such as memory 1306.

These instructions are referred to as program code, computer usable program code, or computer readable program code that may be read and executed by a processor in processor unit 1304. The program code in the different examples may be embodied on different physical or computer readable storage media, such as memory 1306 or persistent storage 1308.

Program code 1318 is located in a functional form on computer readable media 1320 that is selectively removable and may be loaded onto or transferred to computer system 1300 for execution by processor unit 1304. Program code 1318 and computer readable media 1320 form computer program product 1322 in these illustrative examples. In one example, computer readable media 1320 may be computer readable storage media 1324 or computer readable signal media 1326.

In these illustrative examples, computer readable storage media 1324 is a physical or tangible storage device used to store program code 1318 rather than a medium that propagates or transmits program code 1318.

Alternatively, program code 1318 may be transferred to computer system 1300 using computer readable signal media 1326. Computer readable signal media 1326 may be, for example, a propagated data signal containing program code 1318. For example, computer readable signal media 1326 may be an electromagnetic signal, an optical signal, and/or any other suitable type of signal. These signals may be transmitted over communications links, such as wireless communications links, optical fiber cable, coaxial cable, a wire, and/or any other suitable type of communications link.

The different components illustrated for computer system 1300 are not meant to provide architectural limitations to the manner in which different examples may be implemented. The different illustrative examples may be implemented in a computer system including components in addition to and/or in place of those illustrated for computer system 1300. Other components shown in FIG. 13 can be varied from the illustrative examples shown. The different examples may be implemented using any hardware device or system capable of running program code 1318.

Aircraft and Spacecraft Examples

Figure 14:
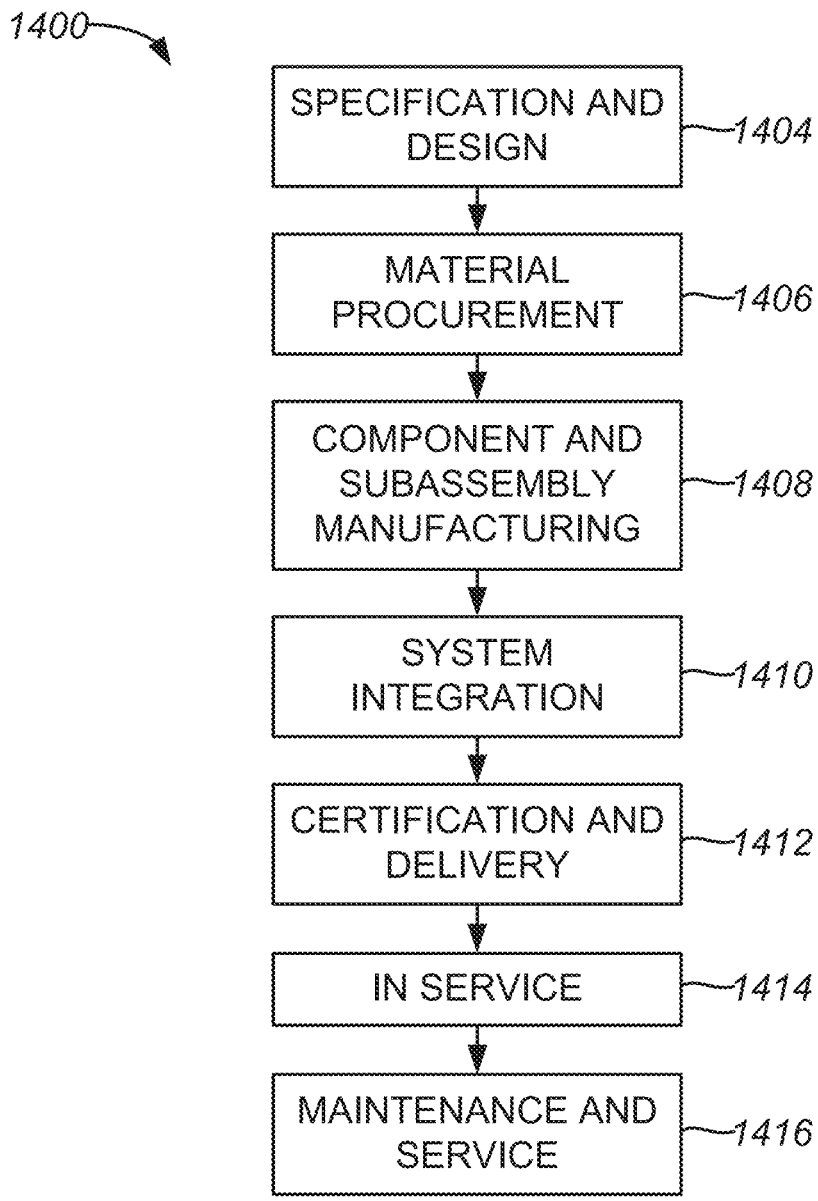
FIG. 14 illustrates a flow chart of an example of an aircraft production and service methodology, implemented in accordance with some embodiments.
Figure 15:
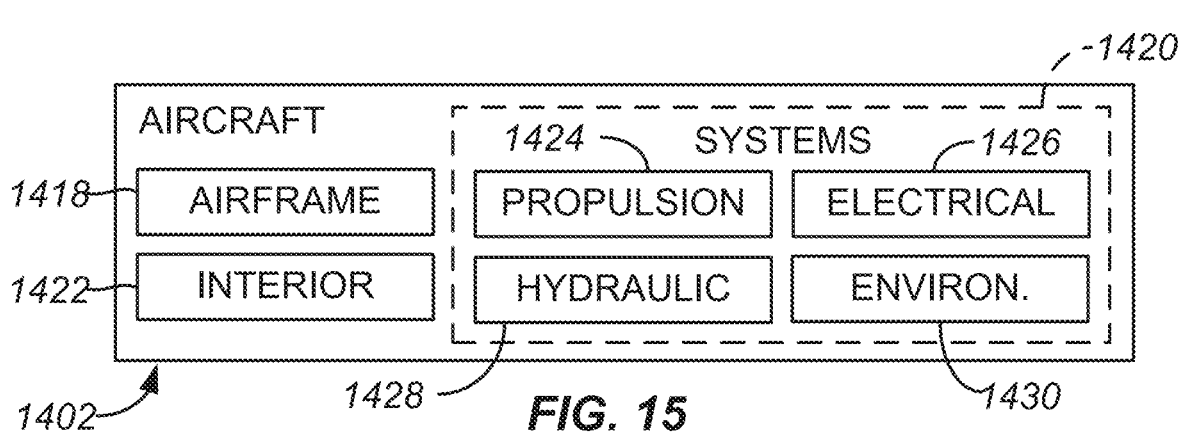
FIG. 15 illustrates a block diagram of an example of an aircraft, implemented in accordance with some embodiments.

As discussed above, various examples of habitation support appliance 100 disclosed herein, such as those discussed above with reference to FIGS. 1A-13, may be integrated with aircraft and spacecraft. Accordingly, the manufacture of such appliances may be described in the context of an aircraft manufacturing and service method 1400 as shown in FIG. 14 and an aircraft 1402 as shown in FIG. 15. During pre-production, illustrative method 1400 may include specification and design 1404 of aircraft 1402 and material procurement 1406. During production, component and subassembly manufacturing stages 1408 and system integration stage 1410 of aircraft 1402 takes place. Thereafter, aircraft 1402 may go through certification and delivery 1412 in order to be placed in service 1414. While in service by a customer, aircraft 1402 is scheduled for routine maintenance and service 1416 (which may also include modification, reconfiguration, refurbishment, and so on).

Each of the processes of method 1400 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 15, aircraft 1402 produced by illustrative method 1400 may include an airframe 1418 with plurality of systems 1420 and an interior 1422. Examples of high-level systems 1420 include one or more of a propulsion system 1424, an electrical system 1426, a hydraulic system 1428, and an environmental system 1430. Any number of other systems may be included. In various examples, appliances, such as habitation support appliance 100 discussed above with reference to FIGS. 1A-13, may be implemented with systems included in systems 1420 or components implemented in interior 1422. Although an aerospace example is shown, the principles of the examples described herein may be applied to other industries.

Devices and methods embodied herein may be employed during any one or more of the stages of method 1400. For example, components or subassemblies corresponding to stages 1408 and 1410 may be fabricated or manufactured in a manner similar to components or subassemblies produced while aircraft 1402 is in service. Also, one or more device examples, method examples, or a combination thereof may be utilized during stages 1408 and 1410, for example, by substantially expediting assembly of or reducing the cost of an aircraft 1402. Similarly, one or more of device examples, method examples, or a combination thereof may be utilized while aircraft 1402 is in service, for example and without limitation, to maintenance and service 1416.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A habitation support appliance comprising:
    a housing defining an internal volume, the housing having an inner surface and an outer surface, the inner surface of the housing comprising a helical groove;
    a front plate coupled to a first end of the housing;
    an end plate coupled to a second end of the housing, the front plate and the end plate being configured to seal the internal volume;

a thermal loop coupled to the outer surface of the housing, the thermal loop configured to transfer thermal energy to and from the housing and the internal volume; and
a mixing device configured to be positioned within the internal volume, and configured to be coupled to the inner surface of the housing via the helical groove to move a position of the mixing device along a linear direction of the housing.

2. The habitation support appliance of claim 1, wherein the thermal loop is configured to heat or cool the internal volume of the housing.

3. The habitation support appliance of claim 2, wherein:
the thermal loop comprises a tube,
the thermal loop is configured to heat the internal volume responsive to receiving heated thermal fluid, and
the thermal loop and is further configured to cool the internal volume responsive to receiving cooled thermal fluid.

4. The habitation support appliance of claim 1 further comprising:
a shaft positioned in the internal volume of the housing; and
a motor coupled to the shaft and configured to rotate the shaft.

5. The habitation support appliance of claim 4, wherein the shaft is coupled to the mixing device such that rotation of the shaft rotates the mixing device.

6. The habitation support appliance of claim 1, wherein the mixing device is configured to be coupled to the helical groove via a first retractable pin bearing.

7. The habitation support appliance of claim 1, wherein the inner surface of the housing further comprises a circular groove at the second end of the housing.

8. The habitation support appliance of claim 1, further comprising a basket configured to be positioned within the internal volume.

9. The habitation support appliance of claim 8, wherein the basket is further configured to be moved along the helical groove of the inner surface.

10. The habitation support appliance of claim 8, wherein the basket is a tumbler.

11. The habitation support appliance of claim 8, further comprising a cover configured to be coupled with the basket.

12. The habitation support appliance of claim 1, further comprising a plunger disc configured to be positioned in the internal volume of the housing.

13. The habitation support appliance of claim 12, further comprising a plurality of electro-magnetic motion control devices coupled to the front plate and the end plate, the plurality of electro-magnetic motion control devices configured to magnetically attract or repel the plunger disc positioned within the internal volume.

14. The habitation support appliance of claim 1, further comprising:
a thermal regulator inlet module coupled to a thermal inlet of the thermal loop, the thermal regulator inlet module configured to regulate thermal energy transferred to the housing; and
a thermal regulator outlet module coupled to a thermal outlet of the thermal loop, the thermal regulator outlet module configured to regulate thermal energy transferred to a vehicle equipped with the habitation support appliance.

15. The habitation support appliance of claim 14, wherein:
the thermal regulator inlet module is configured to heat thermal fluid entering the internal volume responsive to receiving a first current, and
the thermal regulator inlet module is further configured to cool the thermal fluid entering the internal volume responsive to receiving a second current.

16. The habitation support appliance of claim 15, wherein:
the thermal regulator outlet module is configured to heat thermal fluid entering one of vehicle thermal loops responsive to receiving a third current, and
the thermal regulator outlet module is further configured to cool thermal fluid entering one of vehicle thermal loops responsive to receiving a fourth current.

17. A habitation support appliance comprising:
a housing defining an internal volume, the housing having an inner surface and an outer surface, the inner surface comprising a helical groove;
a front plate coupled to a first end of the housing;
an end plate coupled to a second end of the housing, the front plate and the end plate being configured to seal the internal volume;
a thermal loop coupled to the outer surface of the housing, the thermal loop configured to transfer thermal energy to and from the housing and the internal volume;
a thermal regulator inlet module coupled to a thermal inlet of the thermal loop, the thermal regulator inlet module configured to regulate thermal energy transferred to the housing;
a thermal regulator outlet module coupled to a thermal outlet of the thermal loop, the thermal regulator outlet module configured to regulate thermal energy transferred to a vehicle equipped with the habitation support appliance; and
a mixing device comprising a mixing blade configured to be positioned within the internal volume, and configured to be moved along the helical groove of the inner surface.

18. The habitation support appliance of claim 17, wherein the thermal loop comprises a tube, wherein the thermal loop is configured to heat the internal volume responsive to receiving heated thermal fluid, and wherein the thermal loop and is further configured to cool the internal volume responsive to receiving cooled thermal fluid.

19. The habitation support appliance of claim 17, wherein the thermal regulator inlet module and the thermal regulator outlet module each comprise a plurality of Peltier devices.

20. The habitation support appliance of claim 17 further comprising:
a shaft positioned in the internal volume of the housing; and
a motor coupled to the shaft and configured to rotate the shaft, wherein the shaft is coupled to the mixing device such that rotation of the shaft rotates the mixing device.

* * * * *